(12) United States Patent
Kawaguchi et al.

(10) Patent No.: US 8,593,852 B2
(45) Date of Patent: Nov. 26, 2013

(54) TEST DEVICE AND TEST METHOD FOR RESISTIVE RANDOM ACCESS MEMORY AND RESISTIVE RANDOM ACCESS MEMORY DEVICE

(75) Inventors: Kazuaki Kawaguchi, Kanagawa (JP); Kazushige Kanda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 197 days.

(21) Appl. No.: 13/238,479

(22) Filed: Sep. 21, 2011

(65) Prior Publication Data

US 2012/0079330 A1 Mar. 29, 2012

Related U.S. Application Data

(63) Continuation-in-part of application No. 12/752,646, filed on Apr. 1, 2010, now abandoned.

(30) Foreign Application Priority Data

Jul. 23, 2009 (JP) ................................. 2009-172361
Jan. 21, 2011 (JP) ................................. 2011-011059

(51) Int. Cl.
*G11C 11/00* (2006.01)

(52) U.S. Cl.
USPC ........... 365/148; 365/201; 365/158; 365/171; 365/173; 365/163

(58) Field of Classification Search
USPC .................. 365/148, 201, 158, 171, 173, 163
See application file for complete search history.

(56) References Cited

U.S. PATENT DOCUMENTS

| | | | |
|---|---|---|---|
| 5,576,996 A * | 11/1996 | Awaya et al. | 365/189.16 |
| 6,320,819 B2 * | 11/2001 | Tomita et al. | 365/233.11 |
| 7,064,988 B2 | 6/2006 | Inuzuka et al. | |
| 7,889,537 B2 | 2/2011 | Edahiro et al. | |
| 7,911,823 B2 | 3/2011 | Futatsuyama et al. | |

FOREIGN PATENT DOCUMENTS

| | | |
|---|---|---|
| JP | 09-005395 | 1/1997 |
| JP | 2000-293995 | 10/2000 |
| JP | 2004-326951 | 11/2004 |
| JP | 2005-339623 | 12/2005 |

* cited by examiner

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

According to the embodiments, a first write enable signal that changes with a constant period and a second write enable signal that changes at a time portion in which a limit time between activation/deactivation control of word lines and activation/deactivation control of bit lines is checked are input, a plurality of core control signals in which a time interval with which the core control signals change is locally shorter than a period of the first write enable signal based on the first write enable signal and the second write enable signal that are input is generated, and an operation verification of the resistive random access memory is performed by using the generated core control signals, whereby a cycle time in an arbitrary test cycle is locally and arbitrary adjusted.

9 Claims, 21 Drawing Sheets

| COMMAND SIGNAL |
|---|
| CMD55_VROWUP/CMD55_WLDVSEL/<br>CMD55_BLSEL/CMD55_WE2 |
| DATA (USING n BITS) |

| n | n-1 | · · · · · · · · · · · · · · · · · | 2 | 1 |
|---|---|---|---|---|
| SE-<br>QUENCE<br>n | SE-<br>QUENCE<br>n-1 | · · · · · · · · · · · · · · · · · | SE-<br>QUENCE<br>2 | SE-<br>QUENCE<br>1 |

| F_DLYADJ<1> | F_DLYADJ<0> | SELECTED DLYADJ | NUMBER OF STAGES OF DELAY INVERTER |
|---|---|---|---|
| 0 | 0 | <0> | 12 |
| 0 | 1 | <1> | 16 |
| 1 | 0 | <2> | 20 |
| 1 | 1 | <3> | 8 |

# TEST DEVICE AND TEST METHOD FOR RESISTIVE RANDOM ACCESS MEMORY AND RESISTIVE RANDOM ACCESS MEMORY DEVICE

CROSS-REFERENCE TO RELATED APPLICATIONS

This application is a continuation-in-part of U.S. Ser. No. 12/752,646 filed Apr. 1, 2010, and claims the benefit of priority from Japanese Patent Application Nos. 2009-172361 filed Jul. 23, 2009 and 2011-011059 filed Jan. 21, 2011; the entire contents of each of which are incorporated herein by reference.

FIELD

Embodiments described herein relate generally to a test facilitating technology for a resistive random access memory (ReRAM).

BACKGROUND

A resistive random access memory (ReRAM) is a semiconductor memory that uses a material whose resistance changes in accordance with a voltage and attracts attention as a replacement for a flash memory.

DETAILED DESCRIPTION

Figure 1:
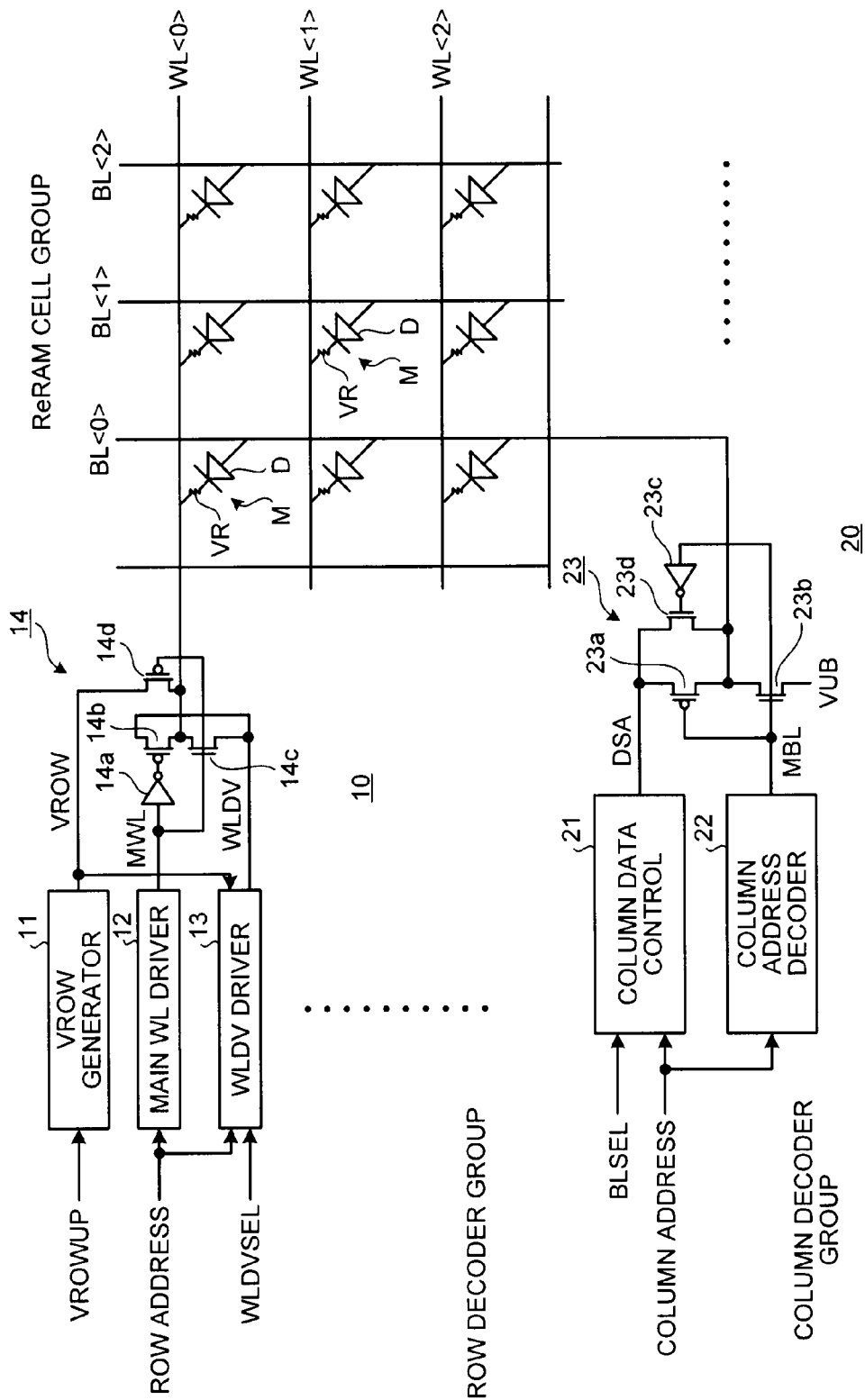
FIG. 1 is a diagram illustrating a configuration of a memory cell array of a ReRAM and a circuit configuration example of a row decoder and a column decoder.

In general, according to one embodiment, a test device comprises: a test device for performing an operation verifying test on a resistive random access memory in which a memory element including a rectifier element and a variable resistance element is arranged at each intersection of a plurality of word lines and a plurality of bit lines and which performs activation/deactivation control of the word lines and activation/deactivation control of the bit lines by using a plurality of core control signals synchronized with a write enable signal and changing one of the core control signals corresponding to each start point of a plurality of sequences, the test device comprising: a shift pulse generating circuit that generates a shift pulse based on a first write enable signal that changes with a constant period and a self generated pulse that is self-generated by using a second write enable signal that changes corresponding to a sequence whose limit time is checked among the sequences; a plurality of shift register circuits each of which includes a plurality of stages of registers that perform a shift operation by the shift pulse and in each of which a signal in each of the sequences of the core control signal to be generated is initially set; and a plurality of core control signal generating circuits each of which includes a first latch circuit that latches an output of a last stage of the shift register circuit by the first write enable signal, a second latch circuit that latches an output of a stage that is one stage before the last stage of the shift register circuit by the first write enable signal, a third latch circuit that latches an output of the second latch circuit by the second write enable signal, and a selector circuit that selects an output of the second latch circuit and the third latch circuit by a switch signal formed by the first write enable signal and the second write enable signal and outputs as the core control signal.

Moreover, according to an embodiment, an operation verifying test is performed on a resistive random access memory in which a memory element including a rectifier element and a variable resistance element is arranged at each intersection of a plurality of word lines and a plurality of bit lines and which performs activation/deactivation control of the word lines and activation/deactivation control of the bit lines by using a plurality of core control signals synchronized with a write enable signal and changing one of the core control signals corresponding to each start point of a plurality of sequences. A first shift register circuit includes shift stages the number of which corresponds to the sequences, and in the first shift register circuit, a shift stage corresponding to a sequence whose limit time is checked among the sequences is initially set to assert and other shift stages are initially set to negate. A shift pulse generating circuit generates a self generated pulse corresponding to the sequence whose limit time is checked among the sequences based on an output of the first shift register circuit and a first write enable signal that changes with a constant period, and generate a shift pulse by synthesizing generated self generated pulse with the first write enable signal. A write enable signal generating unit generates a second write enable signal that changes corresponding to the sequence whose limit time is checked among the sequences based on an output of the first shift register circuit and the first write enable signal.

A plurality of second shift register circuits each include a plurality of stages of registers that perform a shift operation by the shift pulse, and in each of the second shift register circuits, a core control signal to be generated is initially set. A plurality of core control signal generating circuits each include a first latch circuit, a second latch circuit, a third latch circuit, and a selector circuit. The first latch circuit latches an output of a last stage of the second shift register circuit by the first write enable signal. The second latch circuit latches an output of a stage that is one stage before the last stage of the second shift register circuit by the first write enable signal. The third latch circuit latches an output of the second latch circuit by the second write enable signal. The selector circuit selects an output of the second latch circuit and the third latch circuit by a switch signal formed by the first write enable signal and the second write enable signal and outputs as the core control signal.

In an operation verifying test for a semiconductor memory such as the ReRAM, a method is often employed, in which a tester is connected to the semiconductor memory as a test target device, various commands used in the semiconductor memory are generated in the tester to be input to the semiconductor memory, and an output from the semiconductor memory is checked.

In such an operation verifying test for the semiconductor memory, recently, the increase in the number of the semiconductor memories tested simultaneously (the number of Multi-Die test) and the longer testing time are seen as a problem with the increase in capacity and the scaling of the semiconductor memory. The longer testing time limits the number of the semiconductor memories to be manufactured and increases the cost, so that the above problems need to be solved immediately. Therefore, in recent years, for example, the test for the semiconductor memory is often performed by using the tester having an auto mode in which setting of commands to be output and a cycle control are performed by using command pins such as a chip enable pin/CE, a command latch enable pin CLE, an address latch enable pin ALE, a write enable pin/WE, and an I/O port pin IOn-O, and a data pin. When the auto mode is used, the number of pins to be used is reduced, enabling to increase the number of Multi-Die test.

In the tester having such an auto mode, the control cycle of the command setting is synchronized with switching of the write enable pin/WE to L. Because the write enable pin/WE is a signal that is switched to L at a constant cycle, a minimum interval of a test cycle time is determined depending on the cycle of this write enable pin/WE. Therefore, it is difficult to perform the operation verifying test in which the test cycle time is locally set shorter than the minimum test cycle determined by the write enable pin/WE, which is inconvenient in the operation verification for the ReRAM.

In the ReRAM, a special control is performed for activation and deactivation of a word line WL and a bit line BL, and the switching speed of the ReRAM is greatly influenced by the degree of shortening of a time interval between control of the word line WL and control of the bit line BL. However, in the above normal auto mode, the test cycle time cannot be made shorter than the minimum test cycle time determined by the write enable pin/WE, so that it is impossible to tune the time interval between the control of the word line WL and the control of the bit line BL, and the like, which leads to a major problem in that a limit time thereof cannot be checked and a screening test cannot be performed.

Japanese Patent Application Laid-open No. H09-5395 discloses a memory macrocell performance evaluation LSI including a control signal generating circuit that can increase a frequency of the test cycle by generating the write enable signal with a frequency higher that each timing signal based on a plurality of timing signals with different phases that is supplied from outside of the LSI. Although it is disclosed in Japanese Patent Application Laid-open No. H09-5395 to increase the frequency of the test cycle multiple times, the cycle time of the test cycle cannot be locally changed with this technology and therefore this technology cannot be applied to the operation verifying test for the ReRAM described above.

Exemplary embodiments of a test device and a test method for a resistive random access memory and a resistive random access memory device will be explained below in detail with reference to the accompanying drawings. The present invention is not limited to the following embodiments.

(First Embodiment)

FIG. 1 illustrates a configuration of a memory cell array of a resistive random access memory (ReRAM) as a nonvolatile semiconductor memory and a circuit configuration example of a row decoder 10 and a column decoder 20. In the cell array shown in FIG. 1, a memory cell M is provided at each intersection of a plurality of word lines WL and a plurality of bit lines BL. FIG. 1 illustrates a case of a 3×3 cell array, and the memory cell M is provided at each intersection of the word lines WL <0> to WL <2> and the bit lines BL <0> to BL <2>. Each memory cell M includes a variable resistance element VR and a diode D as a rectifier element that are connected in series. The variable resistance element VR is connected to the word line WL at one end and is connected to the bit line BL at the other end via the diode D.

In the variable resistance element VR, a low resistance state is a written state (e.g., "1") and a high resistance state is an erased state (e.g., "0"). A "0" write operation of switching the memory cell M in the low resistance state to the high resistance state is an erasing (or reset) operation, and a "1" write operation of switching the memory cell M in the high resistance state to the low resistance state is a write (or set) operation.

Each word line WL is connected to the row decoder 10 and each bit line BL is connected to the column decoder 20. FIG. 1 illustrates a memory cell arrangement in which the rectifier element is forward biased when a positive bias is applied to the bit line; however, the memory cell arrangement can be employed in which the rectifier element is forward biased when the positive bias is applied to the word line.

Each row decoder 10 includes a VROW generator 11, a main WL driver 12, a WLDV driver 13, and a row gate circuit 14. The VROW generator 11 generates a VROW signal from a VROWUP signal as a core control signal. The main WL driver 12 generates an MWL signal from a row address signal. The WLDV driver 13 generates a WLDV signal from a WLD-VSEL signal, the VROW signal, and the row address signal as the core control signal. The row gate circuit 14 includes a NOT circuit 14a, a P-channel-type MOSFET 14b, an N-channel-type MOSFET 14c, and a P-channel-type MOSFET 14d. The MWL signal is input to the gate of the P-channel-type MOSFET 14b via the NOT circuit 14a, so that a pair of the P-channel-type MOSFET 14b and the N-channel-type MOSFET 14c and the P-channel-type MOSFET 14d operate in a complementary manner based on the MWL signal.

Each column decoder 20 includes a column data control unit 21, a column address decoder 22, and a column gate circuit 23. The column data control unit 21 generates a DSA signal from a BLSEL signal as the core control signal and a column address signal. The column address decoder 22 decodes the column address signal and outputs an MBL signal as a decoding result. The column gate circuit 23 includes a P-channel-type MOSFET 23a, an N-channel-type MOSFET 23b, a NOT circuit 23c, and an N-channel-type MOSFET 23d. The output of the column address decoder 22 is input to the gate of the N-channel-type MOSFET 23d via the NOT circuit 23c, so that a pair of the P-channel-type MOSFET 23a and the N-channel-type MOSFET 23d and the N-channel-type MOSFET 23b operate in a complementary manner based on the output of the column address decoder 22.

Figure 2:
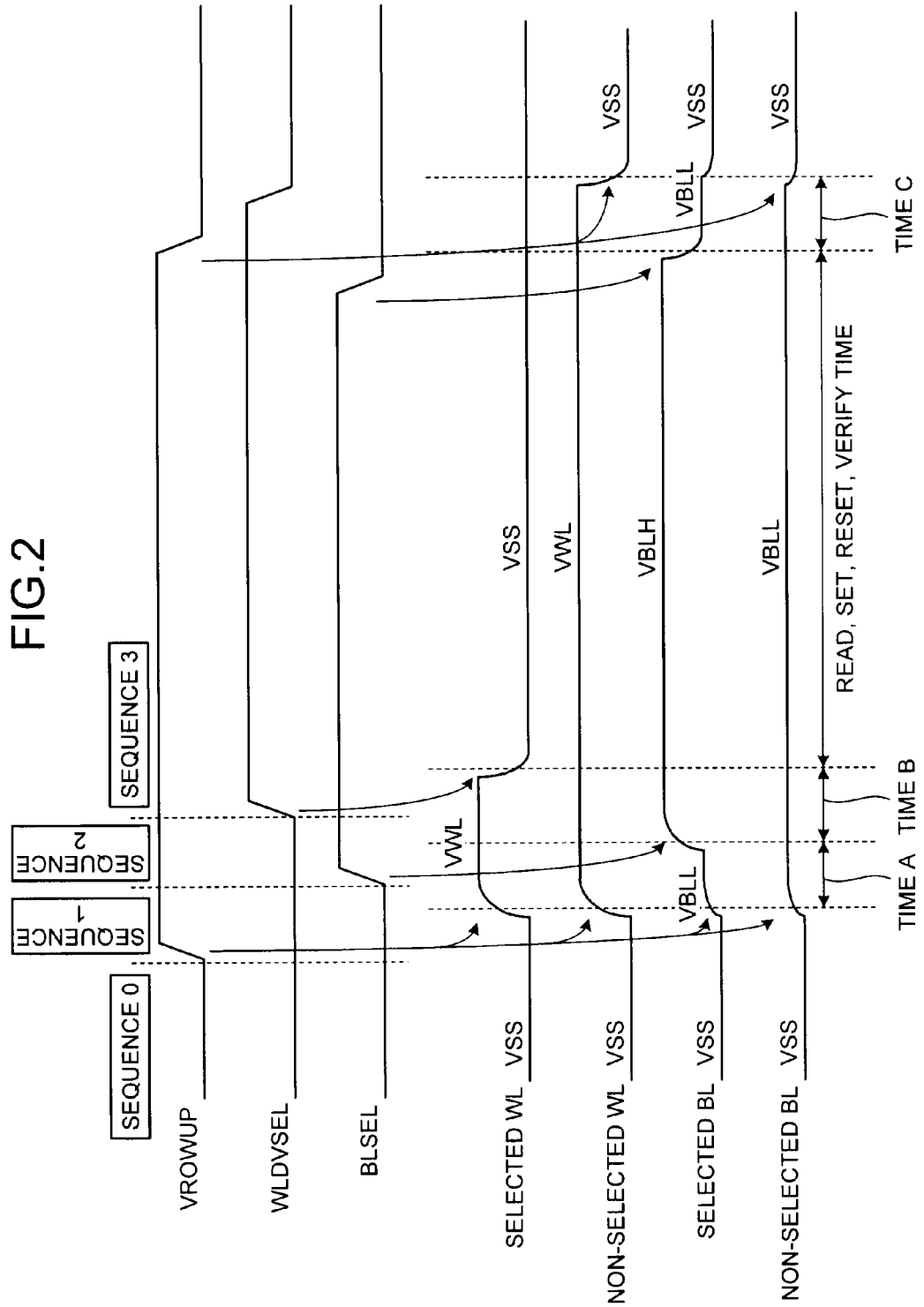
FIG. 2 is a diagram illustrating operation waveform examples of core control signals, word lines, and bit lines.

FIG. 2 illustrates operation waveform examples of activation/deactivation of the word lines WL and the bit lines BL based on the change of the core control signals (VROWUP, WLDVSEL, and BLSEL). The VROWUP signal is a signal for performing control of all of the word lines WL and all of the bit lines BL, the WLDVSEL signal is a signal for performing control of a selected word line WL, and the BLSEL signal is a signal for performing control of a selected bit line BL.

In the initial state, all of the word lines WL and the bit lines BL are at a ground (GND) level Vss. First, all of the word lines are selected by the row address signal and the VROWUP signal is switched from L to H to set all of the word lines (the selected word line and non-selected word lines) to a voltage VWL that is equal to or more than a threshold voltage Vth of a diode D and raise all of the bit lines BL to a voltage VBLL (Vss<VBLL<VBLH). All of the bit lines BL are raised to the voltage VBLL to reduce the potential difference from the voltage VWL, so that a leak current between BL-WL in a non-selected cell can be reduced. Specifically, the MWL signals output from the main WL drivers 12 of all of the row decoders 10 are switched to L by applying the row address signal that selects all of the word lines WL to turn on the P-channel-type MOSFETs 14d of all of the row decoders 10. When the VROWUP signal is switched to H, all of the word lines WL are switched to H by the P-channel-type MOSFETs 14d.

Next, a required bit line is selected by the column address signal and the BLSEL signal is switched from L to H, thereby raising only the selected bit line BL to the voltage VBLH that is equal to or more that the threshold voltage Vth of the diode D. Specifically, the MBL signal output from the column address decoder 22 of the column decoder 20 corresponding to the selected bit line is switched to L by applying the column address signal that selects the required bit line BL to turn on the P-channel-type MOSFET 23a and the N-channel-type MOSFET 23d. When the BLSEL signal is switched to H, only the selected bit line BL is switched to H by the P-channel-type MOSFET 23a and the N-channel-type MOSFET 23d.

Moreover, a required word line is selected by the row address signal and the WLDVSEL signal is switched from L to H, thereby discharging only the selected word line WL to the Vss. Specifically, the MWL signal output from the main WL driver 12 of the row decoder 10 corresponding to the selected word line WL is switched to H by applying the row address signal that selects the required word line to turn on the P-channel-type MOSFET 14b and the N-channel-type MOSFET 14c of the row decoder 10 corresponding to the selected word line WL. When the WLDVSEL signal is switched to H, only the selected word line falls to the Vss to become L by the P-channel-type MOSFET 14b and the N-channel-type MOSFET 14c.

Thus, an arbitrary memory cell M is selected and a desired arbitrary cell access operation including set, rest, read, verify, and the like can be performed on the selected memory cell M. When such a cell access operation is finished, first, the BLSEL signal is switched to L to cause the selected bit line BL to fall to the voltage VBLL. Next, the VROWUP signal is switched to L to cause all of the word lines WL and the bit lines BL to fall to Vss to become L. The WLDVSEL signal falls to L after the VROWUP signal is switched to L.

In the ReRAM, in the activation and deactivation of the word line and the bit line, a three-stage operation of (1) switching all of the word lines from L to H, (2) switching the selected bit line from L to H, and (3) switching the selected word line to L is employed at a time of active, and a two-stage operation of (1) switching the selected bit line from H to L and switching the non-selected word lines from H to L is employed at a time of precharge. With such a special control, the current flowing in the cell can be reduced and a stable cell operation can be realized.

In the operation verifying test for the ReRAM that performs such a special control of the word lines WL and the bit lines BL, an auto mode is typically used, in which a setting of commands to be output and a cycle control are performed by using commands such as a chip enable pin (/CE), a command latch enable pin (CLE), an address latch enable pin (ALE), a write enable pin (/WE), and an I/O port pin (IO<n:0>n is an arbitrary natural number), and a data pin. The number of pins to be used can be reduced by using this auto mode, and the number of Multi-Die test(the number of simlu-test) can be increased.

Figure 3:
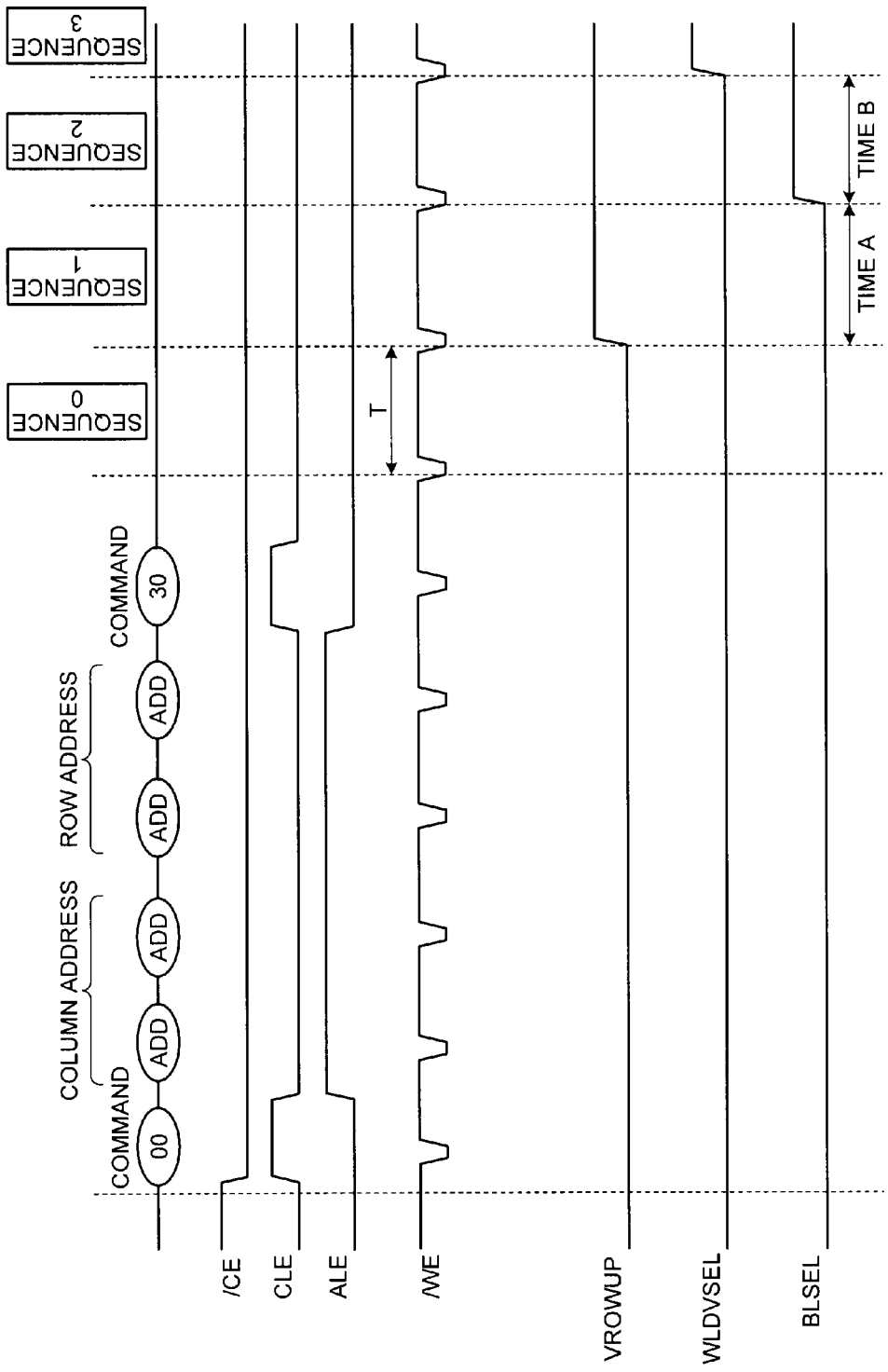
FIG. 3 is an operation waveform diagram in an auto mode of a tester when one write enable signal is used in a conventional manner.

FIG. 3 illustrates an example of an operation waveform diagram in the auto mode when one write enable signal (/WE) is used. In the auto mode shown in FIG. 3, the operation is performed in the state where the chip enable signal (/CE) is L. When the command latch enable signal (CLE) is H, a data input command "00 (hexadecimal number)" is input, and thereafter when the address latch enable signal (ALE) is H, arbitrary column address and row address are input. Thereafter, when the command latch enable signal (CLE) is H, an auto read command is received, for example, by inputting an auto read command "30 (hexadecimal number)", and switching of the core control signals that perform control of the memory core, such as the VROWUP signal, the WLDVSEL signal, and the BLSEL signal, is performed in synchronization with the timing at which the write enable signal (/WE) is switched to L.

In this manner, the core control signals such as the VROWUP signal, the WLDVSEL signal, and the BLSEL signal are generated in synchronization with the/WE signal, and the switching timing (L→H or H→L) of various core control signals is synchronized with the switching of the/WE signal to L. In other words, the start point of each control cycle to be performed by various core control signals is synchronized with the switching of the/WE signal to L. However, it is difficult to change the switching timing of the/WE signal to L for each control cycle, so that when one/WE signal is used, the cycle time cannot be locally changed in an arbitrary control cycle, i.e., in an arbitrary sequence. As described above, when one/WE signal is used, as shown in FIG. 3, the interval of the control cycle, i.e., the interval of each of a sequence 0 to a sequence n is constant. The sequence is a period from the time when arbitrary one of the core control signals such as the VROWUP signal, the WLDVSEL signal, and the BLSEL signal changes to the time when another of the core control signals changes.

Figure 4:
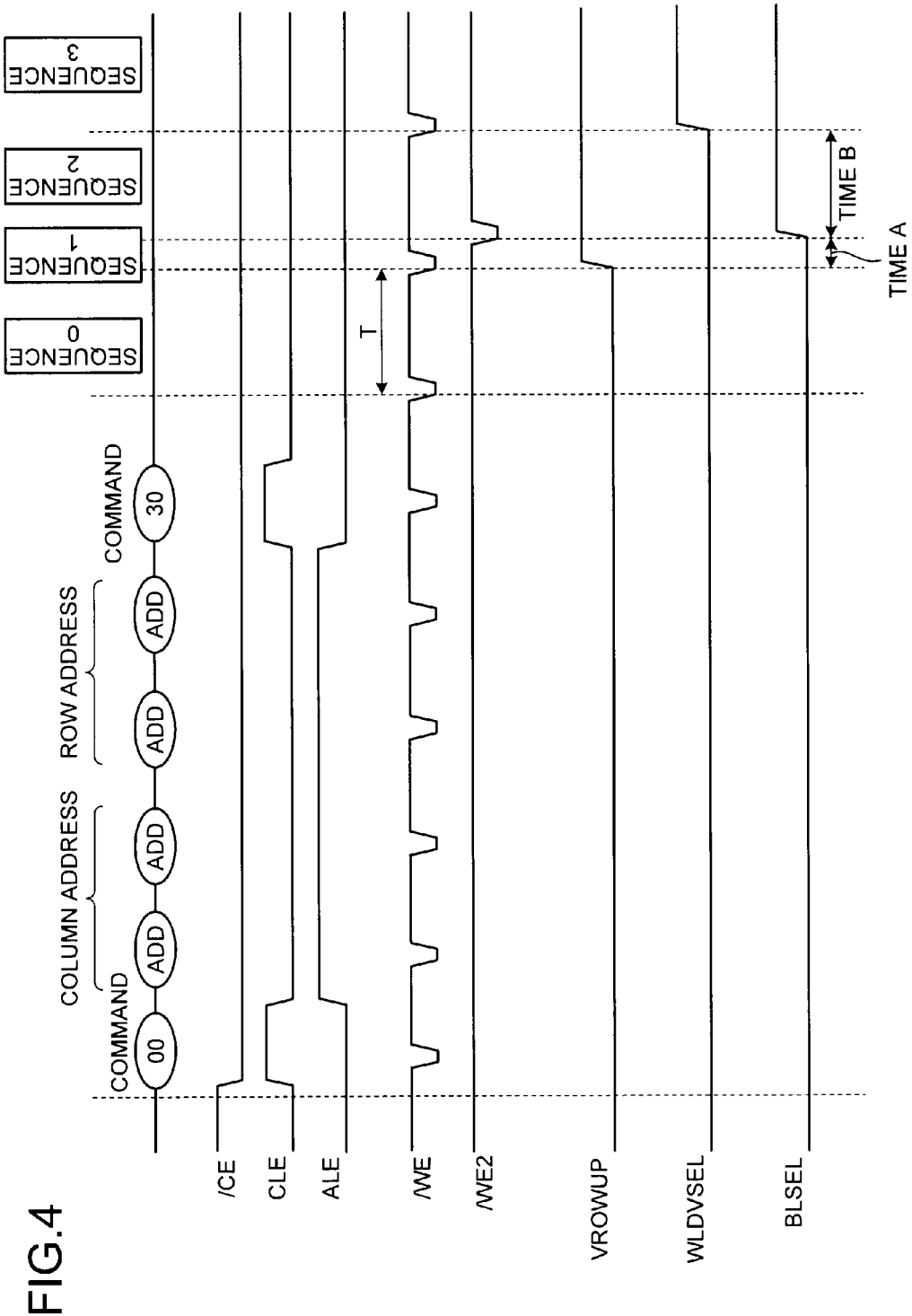
FIG. 4 is an operation waveform diagram in the auto mode of a test circuit according to a first embodiment.

Specially, in activating and deactivating the word line WL and the bit line BL in the ReRAM, the special control as described above is performed. When one write enable signal (/WE) is used, the time interval (a time A, a time B, a time C, or the like in FIG. 2) between the control of the word line WL and the control of the bit line BL cannot be tuned to be shorter than a signal period T of the/WE signal, so that the limit time thereof cannot be checked and the screening test cannot be performed. FIG. 4 illustrates an operation waveform diagram in the auto mode in the first embodiment. In the first embodiment, a second write enable pin (/WE2) is added as the write enable pin in addition to the first write enable pin (/WE). In the case shown in FIG. 3, the starts (ends) of all of the sequences are synchronized with the switching of the first write enable signal (/WE) from H (negate) to L (assert). On the contrary, in the case shown in FIG. 4, the starts of a sequence 1 and a sequence 3 are synchronized with the L switching of the first write enable signal (/WE); however, the start of a sequence 2 is synchronized with the L switching of the second write enable pin (/WE2), so that the time A can be set shorter than the period of the/WE signal.

In this manner, the second write enable pin (/WE2) in which a signal can be input at an arbitrary timing without depending on the first write enable signal (/WE) is newly provided, so that the cycle time in an arbitrary control cycle can be locally and arbitrary set by determining the timing of ending the sequence whose control cycle is required to change by the L switching timing of the second write enable pin (/WE2).

When the cycle time of the sequence 1 is adjusted as shown in FIG. 4, the time A in FIG. 2 can be adjusted, and the time B and the time C can also be adjusted by using the similar control. Accordingly, it is possible to tune the cycle time of the switching of the control of the word line WL and the bit line BL, whereby the checking of the limit time thereof and the screening test can be realized easily.

Figure 5:
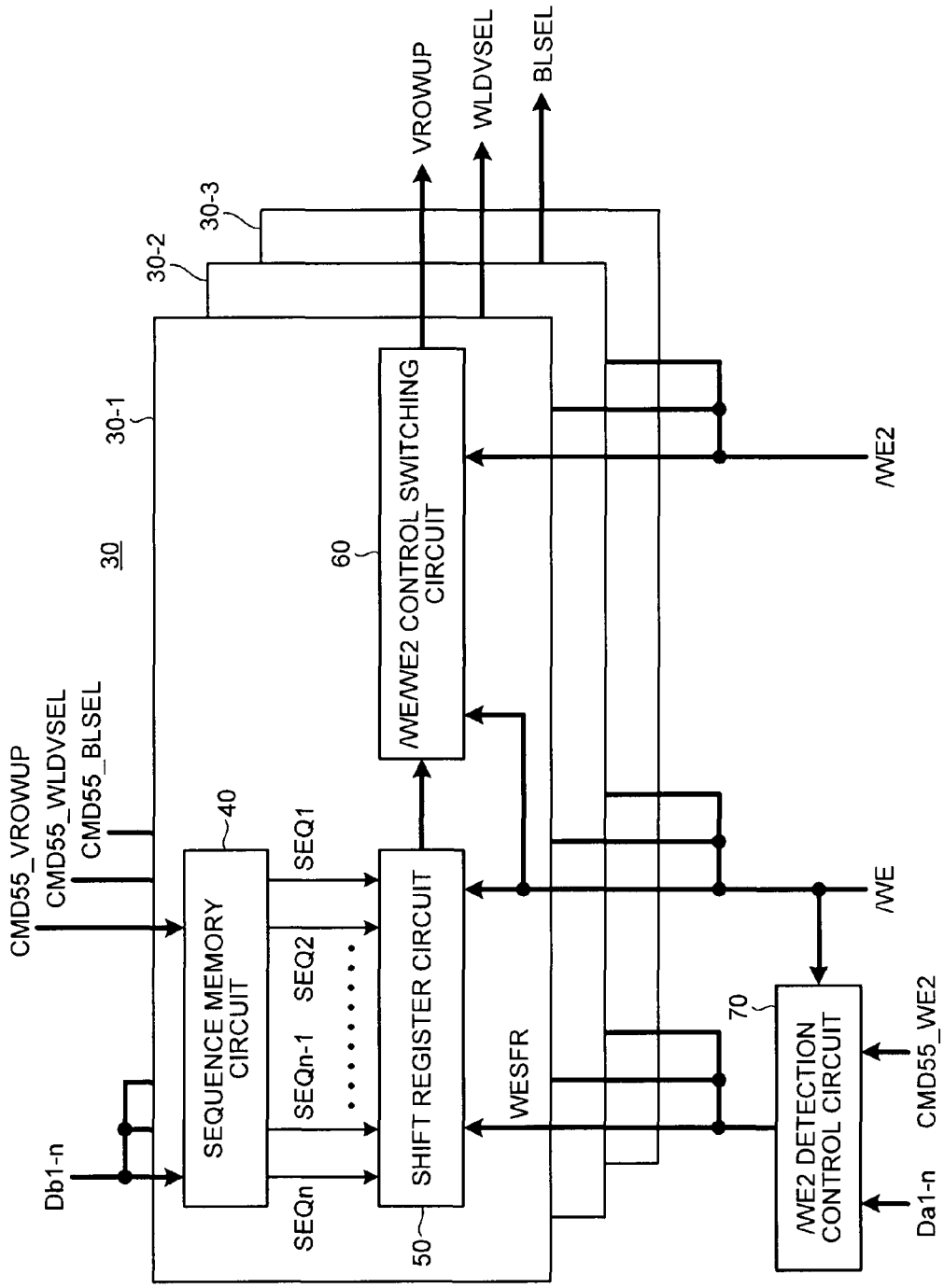
FIG. 5 is a diagram illustrating a configuration example of a core control signal generating portion of the test circuit according to the first embodiment.

FIG. 5 illustrates a configuration example of a core control signal generating portion of a test circuit for performing a test in the auto mode in which the first write enable signal (/WE) and the second write enable pin (/WE2) are used. A test circuit 30 includes a plurality of test circuits the number of which corresponds to the number of the required core control signals. In the case shown in FIG. 5, three individual test circuits 30-1 to 30-3 for generating three signals (the VROWUP signal, the WLDVSEL signal, and the BLSEL signal) as the core control signal are shown. Each of the individual test circuits 30-1 to 30-3 having the same configuration includes a sequence memory circuit 40, a shift register circuit 50, and a/WE/WE2 control switching circuit 60. Moreover, the test circuit 30 includes a/WE2 detection control circuit 70 that is shared by the three individual test circuits 30-1 to 30-3.

Figure 6:
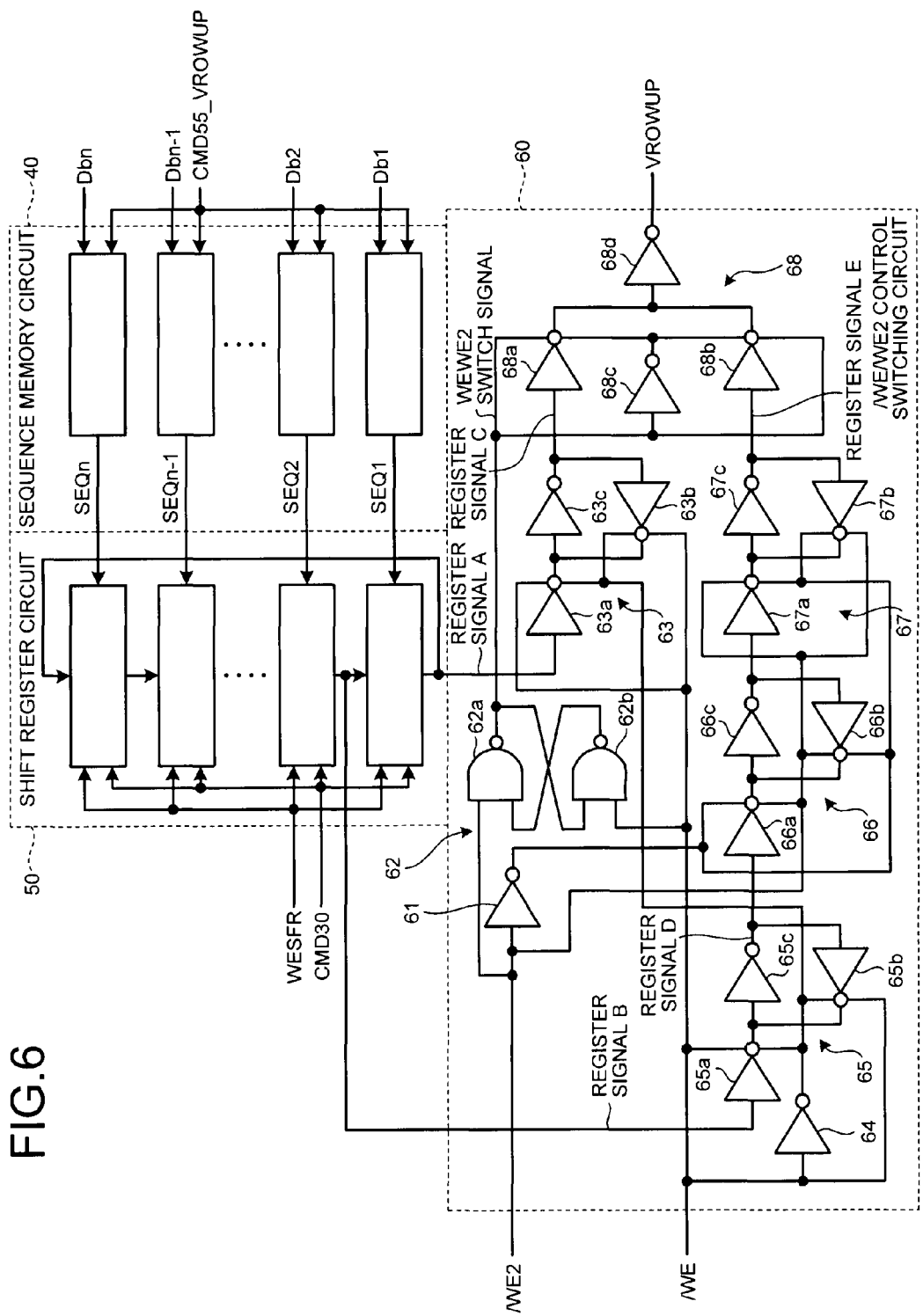
FIG. 6 is a diagram illustrating an internal configuration example of the core control signal generating portion of the test circuit according to the first embodiment.
Figure 7:
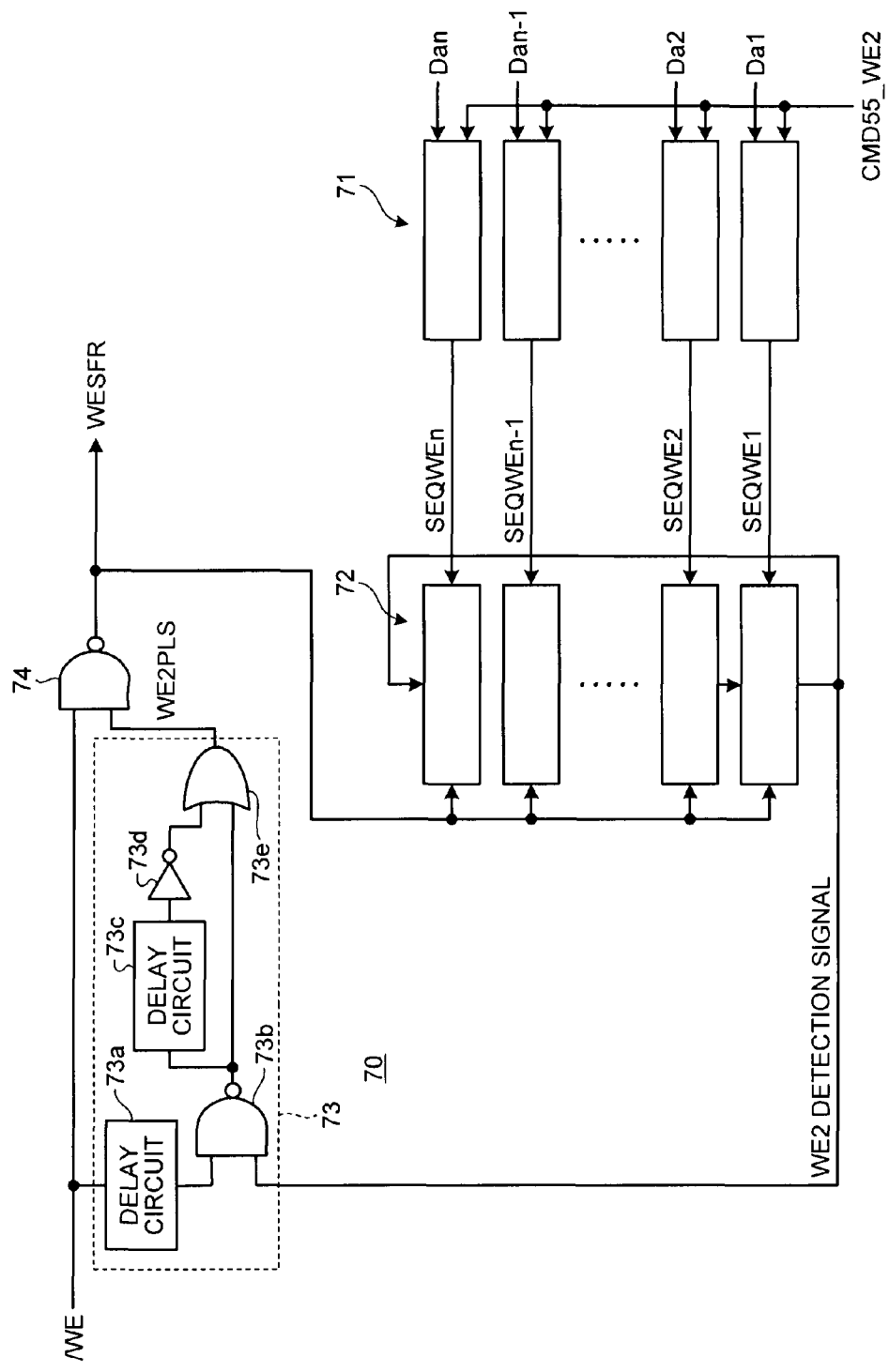
FIG. 7 is a diagram illustrating an internal configuration example of a/WE2 detection control circuit.

FIG. 6 illustrates an internal configuration example of the sequence memory circuit 40, the shift register circuit 50, and the/WE/WE2 control switching circuit 60. FIG. 7 illustrates an internal configuration of the/WE2 detection control circuit 70.

First, the/WE2 detection control circuit 70 shown in FIG. 7 is explained. The/WE2 detection control circuit 70 generates a shift control signal WESFR based on a command (CMD55_WE2), data Da1-n, and the/WE signal, and inputs the generated shift control signal WESFR to the shift register circuit 50. The shift control signal WESFR is used as a shift clock for causing the shift register circuit 50 to perform a shift operation.

As shown in FIG. 7, the/WE2 detection control circuit 70 includes a sequence memory circuit 71, a shift register circuit 72, a pulse self-generating circuit 73, and a NAND circuit 74. The pulse self-generating circuit 73 includes a delay circuit 73a, a NAND circuit 73b, a delay circuit 73c, a NOR circuit 73d, and a NOT circuit 73e.

The sequence memory circuit 71 is a memory for loading an initial value to a register of each stage of the shift register circuit 72, and includes storage bits the number of which corresponds to the number of the stages of the shift register circuit 72. Data Da1-Dan are written in the sequence memory circuit 71 with the input of the command (CMD55_WE2) as a trigger. The data Da1-Dan that set only the cycle to which the/WE2 signal is input to 1 is written in the sequence memory circuit 71. The n-bit data stored in the sequence memory circuit 71 is written in the registers of respective stages of the shift register circuit 72 as initial values SEQWE1 to SEQWEn. The shift register circuit 72 performs the shift operation based on the shift control signal WESFR, and the output of the register of the last stage is fed back to the input of the register of the first stage for performing a repeat operation in units of a plurality of sequences. The output of the shift register circuit 72 is input to the pulse self-generating circuit 73 as the WE2 detection signal.

The pulse self-generating circuit 73 is a circuit for outputting a self generated pulse WE2PLS from the NOT circuit 73e based on the WE2 detection signal, and the inverted signal of the self generated pulse WE2PLS output from the NOT circuit 73e is ORed with the inverted signal of the first write enable signal/WE by the NAND circuit 74 and is output as the positive-logic shift control signal WESFR. In the pulse self-generating circuit 73, the rise and fall of the WE2 detection signal are delayed by performing delay processing by using the/WE signal to adjust the time at which the self generated pulse WE2PLS is generated. In other words, the NAND circuit 74 generates the positive-logic shift control signal (shift pulse) WESFR that is obtained by adding the self generated pulse WE2PLS to the first write enable signal/WE, and the generated shift control signal WESFR is input to the shift register circuit 72.

Next, the configuration of the individual test circuit 30-1 that generates the VROWUP signal is explained with reference to FIG. 5 and FIG. 6. The configuration of other individual test circuits 30-2 and 30-3 is similar to that of the individual test circuit 30-1, so that overlapping explanation is omitted. The sequence memory circuit 40 has a configuration similar to that of the sequence memory circuit 71 explained above, and includes storage bits the number of which corresponds to the number of stages of the shift register circuit 50. The sequence memory circuit 40 is a memory for loading initial values SEQ1-SEQn to the registers of respective stages of the shift register circuit 50, and data Db1-Dbn are written in the sequence memory circuit 40 with the input of a parameter set command (CMD55_VROWUP) as a trigger. In the present embodiment, for example, the stored data in the sequence memory circuit 40 is loaded to the shift register circuit 50 as an initial value in the period of the sequence 0 shown in FIG. 4. As shown in FIG. 4, the VROWUP signal is H in the period of the sequence 1, H in the period of the sequence 2, and H in the period of the sequence 3, and such signal waveform is obtained by storing values "1", "1", and "1" in the data Db1, Db2, and Db3 of the sequence memory circuit 40. The WLDVSEL signal is L in the period of the sequence 1, L in the period of the sequence 2, and H in the period of the sequence 3, so that values "0", "0", and "1" are stored in the data Db1, Db2, and Db3 of the sequence memory circuit 40. In the similar manner, the BLSEL signal is L in the period of the sequence 1, H in the period of the sequence 2, and H in the period of the sequence 3, so that values "0", "1", and "1" are stored in the data Db1, Db2, and Db3 of the sequence memory circuit 40.

The shift register circuit 50 performs the shift operation based on the shift control signal WESFR input from the/WE2 detection control circuit 70, and the output (register signal A) of the register of the last stage is fed back to the input of the register of the first stage for performing a repeat operation in units of a plurality of sequences.

The/WE/WE2 control switching circuit 60 includes a NOT circuit 61, a set-reset flip-flop (SRFF) 62 that includes two two-input NAND circuits 62a and 62b, a register circuit (latch circuit) 63 that includes two clocked NOT circuits 63a and 63b and a NOT circuit 63c, a NOT circuit 64, a first-stage register circuit (first-stage latch circuit) 65 that includes two clocked NOT circuits 65a and 65b and a NOT circuit 65c, a second-stage register circuit (second-stage latch circuit) 66 that includes two clocked NOT circuits 66a and 66b and a NOT circuit 66c, a third-stage register circuit (third-stage latch circuit) 67 that includes two clocked NOT circuits 67a and 67b and a NOT circuit 67c, and a selector circuit 68 that includes two clocked NOT circuits 68a and 68b and two NOT circuits 68c and 68d.

In the register circuit 63, the output (register signal A) of the last stage of the shift register circuit 50 is input and the first write enable signal/WE is input to the clocked NOT circuits 63a and 63b, so that the register circuit 63 transfers the input signal (register signal A) to the output (register signal C) thereof only when the first write enable signal/WE is switched to L.

In the first-stage register circuit 65, the output (register signal B) of the stage one stage before the last stage of the shift register circuit 50 is input and the first write enable signal/WE is input to the clocked NOT circuits 65a and 65b, so that the first-stage register circuit 65 transfers the input signal (register signal B) to the output (register signal D) thereof only when the first write enable signal/WE is switched to L.

In the second-stage register circuit 66, the register signal D is input and the second write enable signal/WE2 is input to the clocked NOT circuits 66a and 66b, so that the second-stage register circuit 66 transfers the input signal (register signal D) to the output thereof only when the second write enable signal/WE2 is switched to L. In the similar manner, in the third-stage register circuit 67, the output of the second-stage register circuit 66 is input and the second write enable signal/WE2 is input to the clocked NOT circuits 67a and 67b, so that the third-stage register circuit 67 transfers the input signal to the output (register signal E) thereof only when the second write enable signal/WE2 is switched to L.

The SRFF 62 generates a WEWE2 switch signal for switching between the register signal C and register signal E by using the first write enable signal/WE and the second write enable signal/WE2. The selector circuit 68 switches between the register signal C and register signal E based on the WEWE2 switch signal and outputs the switching output thereof as the core control signal VROWUP.

Next, the operations of the individual test circuit 30-1 that generates the VROWUP signal as the core control signal and the/WE2 detection control circuit 70 are explained with reference to a time chart shown in FIG. 8. In this operation example, as shown in FIG. 4, a cycle time A of the sequence 1 is made shorter by using the second write enable signal/WE2 than the case of using only the first write enable signal/WE.

Figure 8:
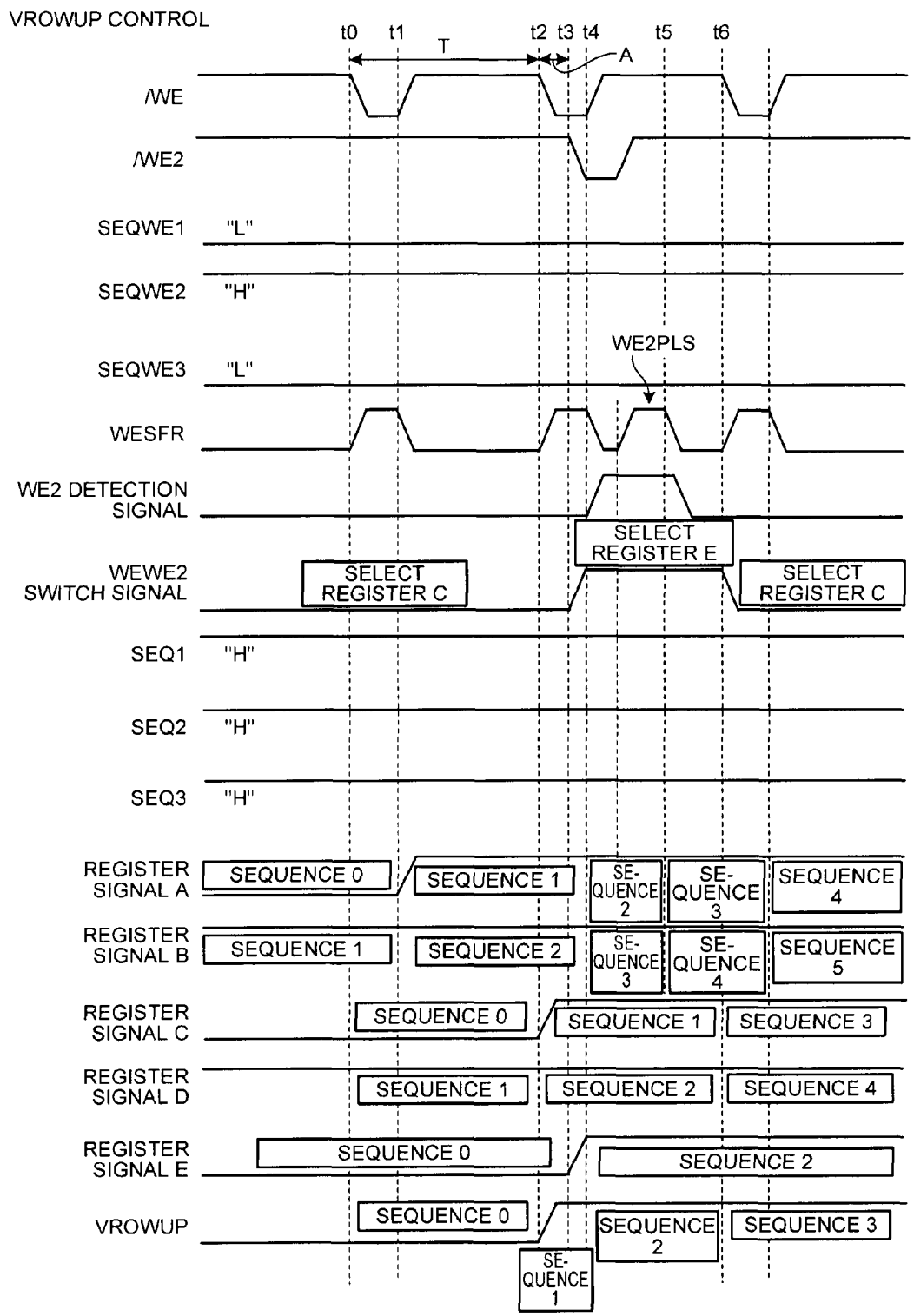
FIG. 8 is a time chart illustrating various signal waveforms for generating a VROWUP signal.

As shown in FIG. 8, the/WE signal falls to L with a predetermined period T. The/WE2 signal is a signal having an L holding time same as that of the/WE signal, and the timing of ending the sequence whose cycle time is required to change is determined at an L switching point of the/WE2 signal. In this case, because the cycle time A of the sequence 1 is made short, the/WE2 signal is set so that the fall ends after the time A from a fall point t2 of the second/WE signal corresponding to the start point of the sequence 1. Moreover, the data Da1-n input to the sequence memory circuit 71 are set so that the WE2 detection signal becomes H only in the cycle in which the/WE2 signal is inserted. As shown in FIG. 4, because the/WE2 signal is inserted in the sequence 2, values 0, 1, 0, . . . are input as the data Da1-n input to the sequence memory circuit 71. Therefore, values 0, 1, 0 are initially set in three registers on the side of the last stage of the shift register circuit 72 by SEQWE1-3 signals.

The shift register circuit 72 performs the shift operation by the fall of the WESFR signal. As described above, the WESFR signal is obtained by ORing the inverted signal of the/WE signal and the self-generated pulse WE2PLS self-generated in the pulse self-generating circuit 73 based on the WE2 detection signal. Because values 0, 1, 0 are set in the three registers on the side of the last stage of the shift register circuit 72, the WE2 detection signal rises to H at a time t4 by the fall of the WESFR signal at the time t4. The self generated pulse WE2PLS is generated in the pulse self-generating circuit 73 by the rise of this WE2 detection signal, and one pulse is added to the WESFR signal by this self generated pulse WE2PLS. The WE2 detection signal falls to L following the fall of the self-generated WESFR signal to L.

On the other hand, the initial values of the shift register circuit 50 are loaded at an appropriate time before the operation of the test circuit to the sequence memory circuit 40. As shown in FIG. 4, the VROWUP signal is H in the period of the sequence 1, H in the period of the sequence 2, and H in the period of the sequence 3, so that values "1", "1", and "1" are stored in the data Db1, Db2, and Db3 of the sequence memory circuit 40. The initial values stored in the sequence memory circuit 40 are set to the respective registers of the shift register circuit 50 before the shift operation of the shift register circuit 50 starts. Next, the register signals A to E are explained.

In the register signal A that is the output of the last stage of the shift register circuit 50, the initial values SEQ1, SEQ2, SEQ3, . . . appear in order in synchronization with the fall of the WESFR signal to L.

Because the SEQ1, SEQ2, SEQ3=1, 1, 1, the register signal A rises to H at a time t1 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=1, 1, the register signal B holds H from the beginning.

To the register signal C that is the output of the register circuit 63, the input signal (register signal A) is transferred only when the first write enable signal/WE is switched to L, so that the register signal C rises to H at the fall time t2 of the/WE signal.

To the register signal D that is the output of the first-stage register circuit 65, the input signal (register signal B) is transferred only when the first write enable signal/WE is switched to L, so that the register signal D holds H from the beginning in the similar manner to the register signal B.

The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E rises to H at a fall time t3 of the/WE2 signal.

The WEWE2 switch signal output from the SRFF 62 is a switching signal between the register signal C and register signal E, and rises to H by the fall of the/WE2 signal and falls to L by the fall of the/WE signal thereafter. The selector circuit 68 selects the register signal C when the WEWE2 switch signal is L and selects the register signal E when the WEWE2 switch signal is H. Therefore, the VROWUP signal that is the output of the selector circuit 68 holds L until the time t2 and holds H after the time t2.

In this manner, at the time of the control by the second write enable signal/WE2 (the WE2 detection signal is H at the L switching time of the/WE2 signal), the register signals A and B perform the shift operation once more time by the self generation of the shift control signal WESFR after the/WE signal is switched to H. On the other hand, because the register signals C and D capture the input signal only when the/WE signal is switched to L, the register signals C and D are not subjected to the control by the self generation of the shift control signal WESFR and sequence information before performing the shift operation once more time is held. Furthermore, the register signal D is transferred to the register signal E only when the/WE2 signal is switched to L. Thereafter, information on the register signal C and the register signal E is transferred to the core control signal by using the WEWE2 switch signal, thereby realizing changing of the cycle time in the sequence 1 and the sequence 3.

Figure 9:
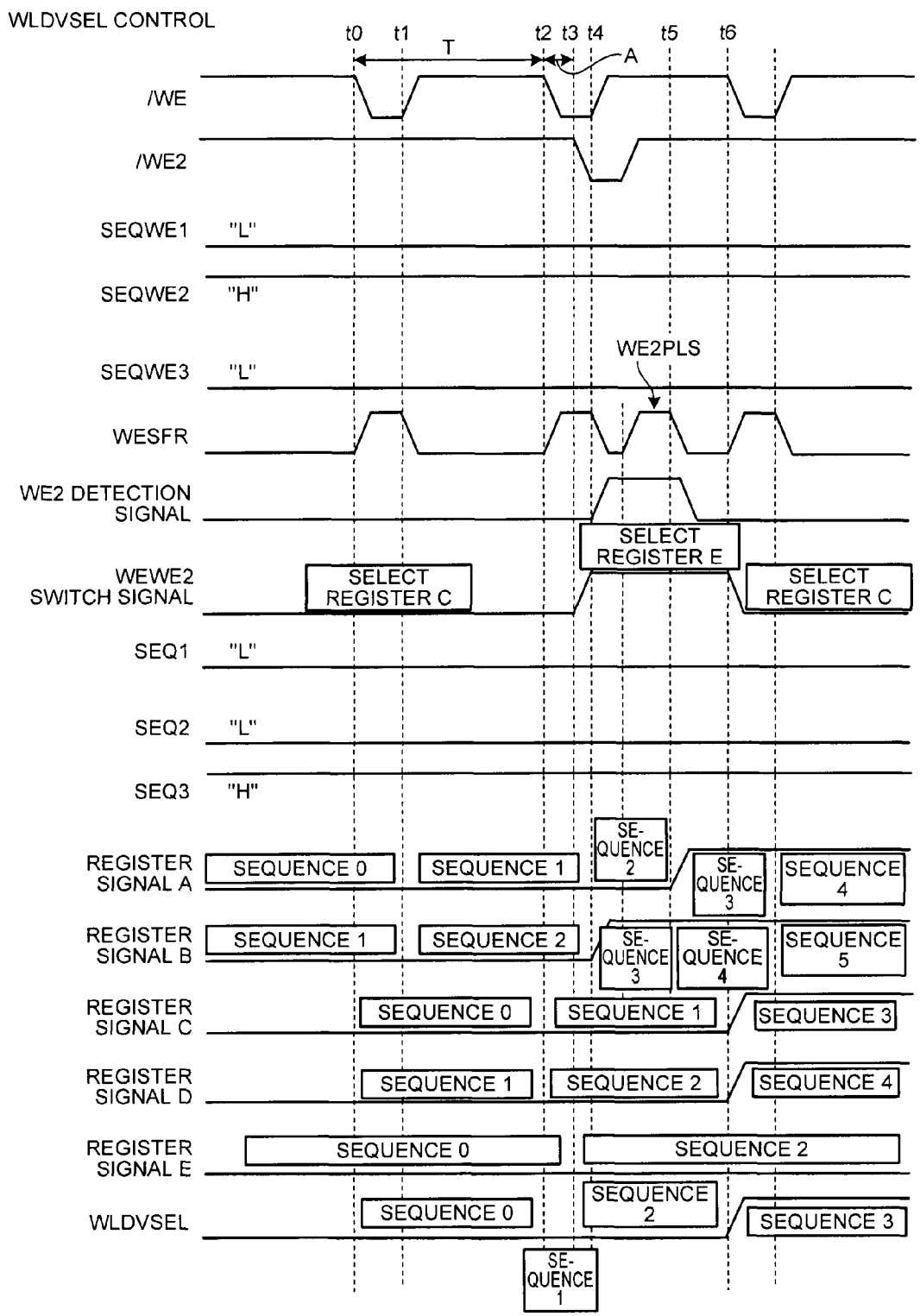
FIG. 9 is a time chart illustrating various signal waveforms for generating a WLDVSEL signal.

Next, the operations of the individual test circuit 30-2 that generates the WLDVSEL signal as the core control signal and the/WE2 detection control circuit 70 are explained with reference to a time chart shown in FIG. 9. The waveforms of the/WE, the/WE2, the SEQ1 to SEQ3, the WESFR, the WE2 detection signal, and the WEWE2 switch signal shown in FIG. 9 are similar to those shown in FIG. 8.

As shown in FIG. 4, the WLDVSEL signal is L in the period of the sequence 1, L in the period of the sequence 2, and H in the period of the sequence 3, so that values "0", "0", and "1" are stored as the data Db1, Db2, and Db3 stored in the sequence memory circuit 40.

In the register signal A that is the output of the last stage of the shift register circuit 50, the initial values SEQ1, SEQ2, SEQ3, . . . appear in order in synchronization with the fall of the WESFR signal to L. Because the SEQ1, SEQ2, SEQ3=0, 0, 1, the register signal A rises to H at a time t5 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=0, 1, the register signal B rises to H at the time t4 and holds H for a predetermined period thereafter.

To the register signal C that is the output of the register circuit 63, the input signal (register signal A) is transferred only when the first write enable signal/WE is switched to L, so that the register signal C rises to H at a fall time t6 of the/WE signal.

To the register signal D that is the output of the first-stage register circuit 65, the input signal (register signal B) is transferred only when the first write enable signal/WE is switched to L, so that the register signal D rises to H at the fall time t6 of the/WE signal.

The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E holds L during the time shown in FIG. 9.

The selector circuit 68 selects the register signal C when the WEWE2 switch signal is L and selects the register signal E when the WEWE2 switch signal is H. Therefore, the WLDVSEL signal that is the output of the selector circuit 68 holds L until the time t6 and holds H after the time t6.

Next, the operations of the individual test circuit 30-3 that generates the BLSEL signal as the core control signal and the/WE2 detection control circuit 70 are explained with reference to a time chart shown in FIG. 10.

Figure 10:
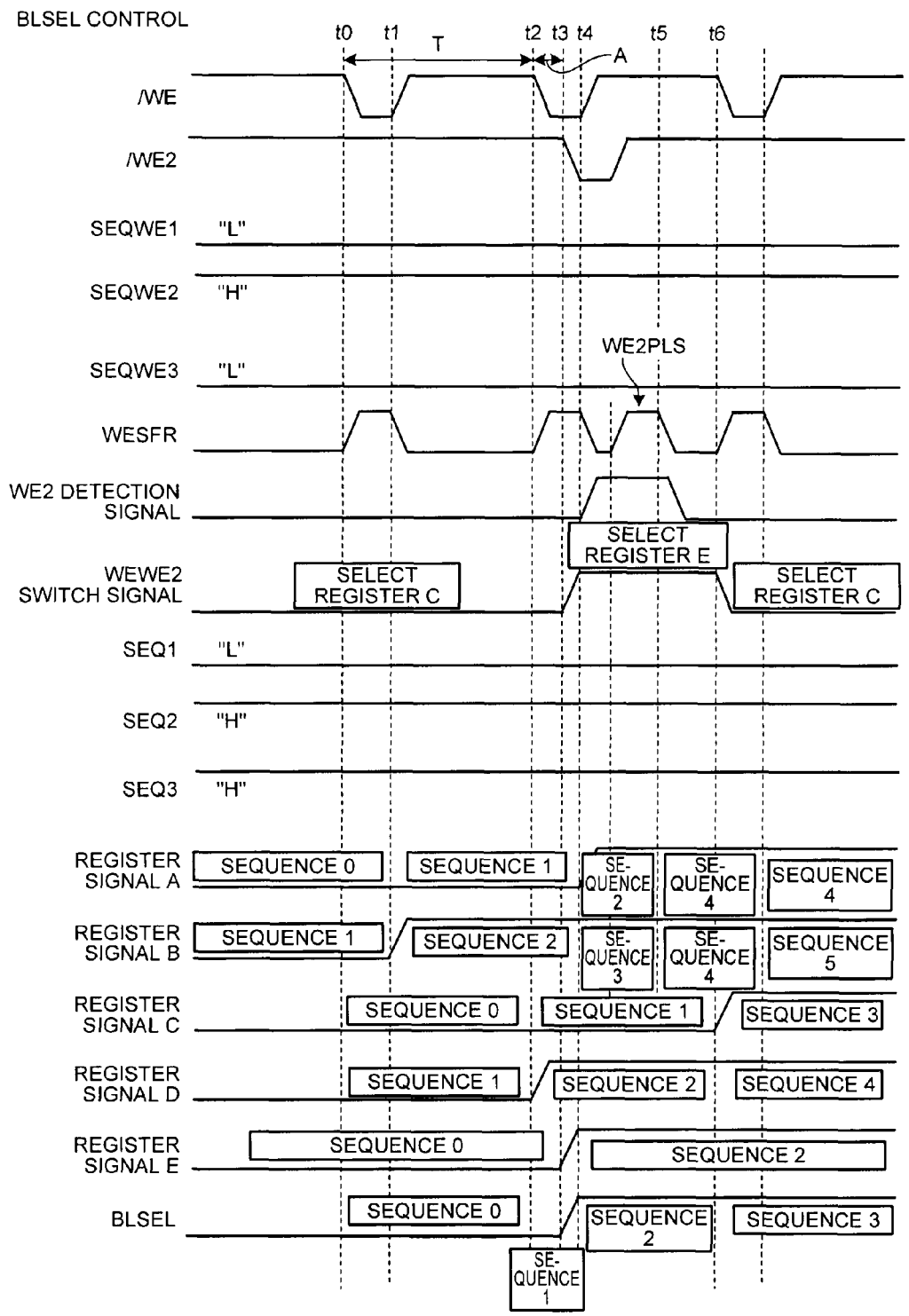
FIG. 10 is a time chart illustrating various signal waveforms for generating a BLSEL signal.

The waveforms of the/WE, the/WE2, the SEQ1 to SEQ3, the WESFR, the WE2 detection signal, and the WEWE2 switch signal shown in FIG. 10 are similar to those shown in FIG. 8 and FIG. 9.

As shown in FIG. 4, the BLSEL signal is L in the period of the sequence 1, H in the period of the sequence 2, and H in the period of the sequence 3, so that values "0", "1", and "1" are stored as the data Db1, Db2, and Db3 stored in the sequence memory circuit 40.

In the register signal A that is the output of the last stage of the shift register circuit 50, the initial values SEQ1, SEQ2, SEQ3, . . . appear in order in synchronization with the fall of the WESFR signal to L. Because the SEQ1, SEQ2, SEQ3=0, 1, 1, the register signal A rises to H at the time t4 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=1, 1, the register signal B rises to H at the time t1 and holds H for a predetermined period thereafter.

To the register signal C that is the output of the register circuit 63, the input signal (register signal A) is transferred only when the first write enable signal/WE is switched to L, so that the register signal C rises to H at the fall time t6 of the/WE signal.

To the register signal D that is the output of the first-stage register circuit 65, the input signal (register signal B) is transferred only when the first write enable signal/WE is switched to L, so that the register signal D rises to H at the fall time t2 of the/WE signal.

The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E rises to H at the fall time t3 of the/WE2 signal.

The selector circuit 68 selects the register signal C when the WEWE2 switch signal is L and selects the register signal E when the WEWE2 switch signal is H. Therefore, the BLSEL signal that is the output of the selector circuit 68 holds L until the time t3 and holds H after the time t3.

The test circuits shown in FIG. 5 to FIG. 7 operate normally even when only the first write enable signal/WE is used and the second write enable signal/WE2 is not used. When the second write enable signal/WE2 is not used (the WE2 detection signal is fixed to L), only the register signals A and C are used and the register signals B, D, and E are not used. In this case, the register signal A holds arbitrary sequence data during the period from the L switching time to the next L switching time of the shift control signal WESFR controlled only by the first write enable signal/WE, and the first write enable signal/WE is switched to L during this period, so that the arbitrary sequence data is output at the L switching time of the first write enable signal/WE.

In the test circuit, the operation verifying test for the ReRAM is performed by inputting the core control signals (the VROWUP signal, the WLDVSEL signal, and the BLSEL signal) generated in this manner to the ReRAM as a test target device and checking the output thereof through monitoring.

According to the first embodiment, an arbitrary cycle can be locally set to the cycle time different from other cycles by using the second write enable pin together with the first write enable pin used for controlling the cycle in the normal operation, so that it is possible to perform the operation verifying test for the limit time of the time interval of activation and deactivation of the word line and the bit line in the ReRAM operating at high speed.

(Second Embodiment)

Figures 11, 12:
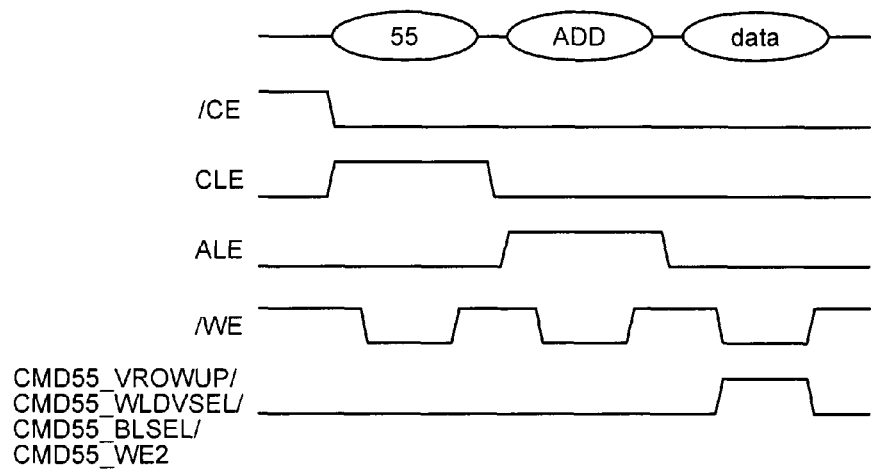
FIG. 11 is a time chart illustrating a data set operation for sequence memory circuits by using a parameter set command.
FIG. 12 is a diagram schematically illustrating a data storage unit in which data is stored corresponding to a command signal.

Next, the second embodiment of the present invention is explained with reference to FIG. 11 to FIG. 13. In the second embodiment, explanation is given for the configuration for setting data to the sequence memory circuits 40 and 71 by using a parameter set command 55. FIG. 11 is a time chart illustrating a procedure of data setting to the sequence memory circuits 40 and 71 by using the parameter set command 55, and FIG. 12 illustrates an example of a data storage unit for the sequence memory circuit in which data is stored corresponding to a command signal.

Specifically, as shown in FIG. 11, the operation is performed in the state where the chip enable signal (/CE) is L. The parameter set command 55 is input in the period in which the command latch enable signal (CLE) is H and the/WE signal is L, and thereafter, an arbitrary address is input in the period in which the address latch enable signal (ALE) is H and the/WE signal is L. Thereafter, data is input and arbitrary command signals (CMD_55VROWUP, CMD_55WLDVSEL, CMD_55BLSEL, and CMD_55WE2) are input based on address information that is input in advance in the period in which the/WE signal is L, so that data shown in FIG. 12 is set as desired data in the data storage unit with respect to the sequence memory circuits 40 and 71.

In the data storage unit shown in FIG. 12, data (n bits) that needs to be set to the sequence memory circuits 40 and 71 is stored in advance for each command signal (CMD_55VROWUP, CMD_55WLDVSEL, CMD_55BLSEL, and CMD_55WE2), and this storage data is used as the input data Db1-$n$ to the sequence memory circuit 40 shown in FIG. 6 and the input data Da1-$n$ to the sequence memory circuit 71 shown in FIG. 7. With such a method by the parameter set command, the/WE2 signal does not need to be directly detected for generating the WE2 detection signal for detecting that the L switching of the/WE2 signal is input locally only in the sequence corresponding to an arbitrary cycle, and it is sufficient to input required information to the sequence memory circuit 71, so that the L switching control of the/WE2 can be used only for an arbitrary cycle more easily. For example, if the control of the/WE2 signal is used at the start time of the sequence 2 for changing the cycle time of the sequence 1, it is possible to switch to the/WE2 control only at the start time of the sequence 2 by inputting "50 (hexadecimal number)" for the address and "02 (hexadecimal number)" for the data.

Figure 13:
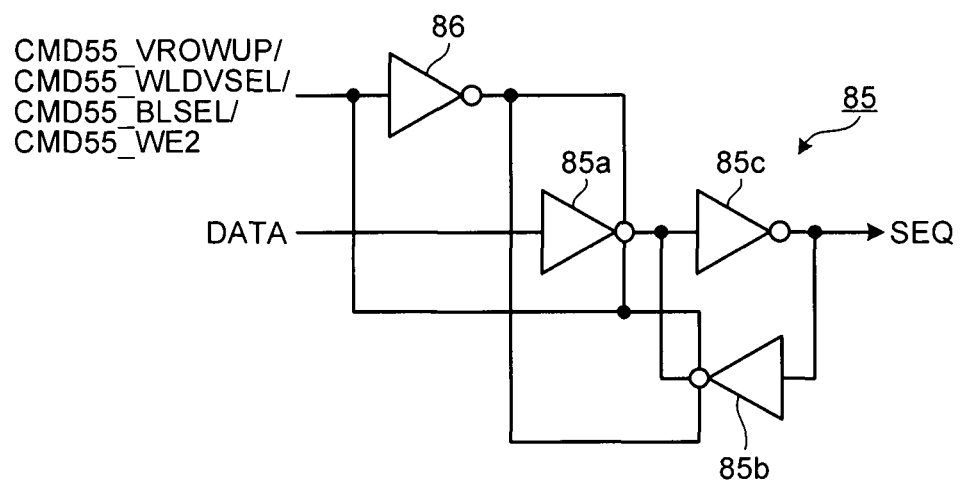
FIG. 13 is a diagram illustrating a specific circuit configuration example of the sequence memory circuit.

FIG. 13 illustrates a configuration example of a one-bit storage circuit of the sequence memory circuits 40 and 71. In this circuit example, the one-bit storage circuit includes a register circuit 85 that includes two clocked NOT circuits 85$a$ and 85$b$ and a NOT circuit 85$c$ and a NOT circuit 86, and latches data when the command signals (CMD_55VROWUP, CMD_55WLDVSEL, CMD_55BLSEL, and CMD_55WE2) are input.

According to the second embodiment, the data setting of the sequence memory circuits 40 and 71 can be performed easily by using the parameter set command.

(Third Embodiment)

Figure 14:
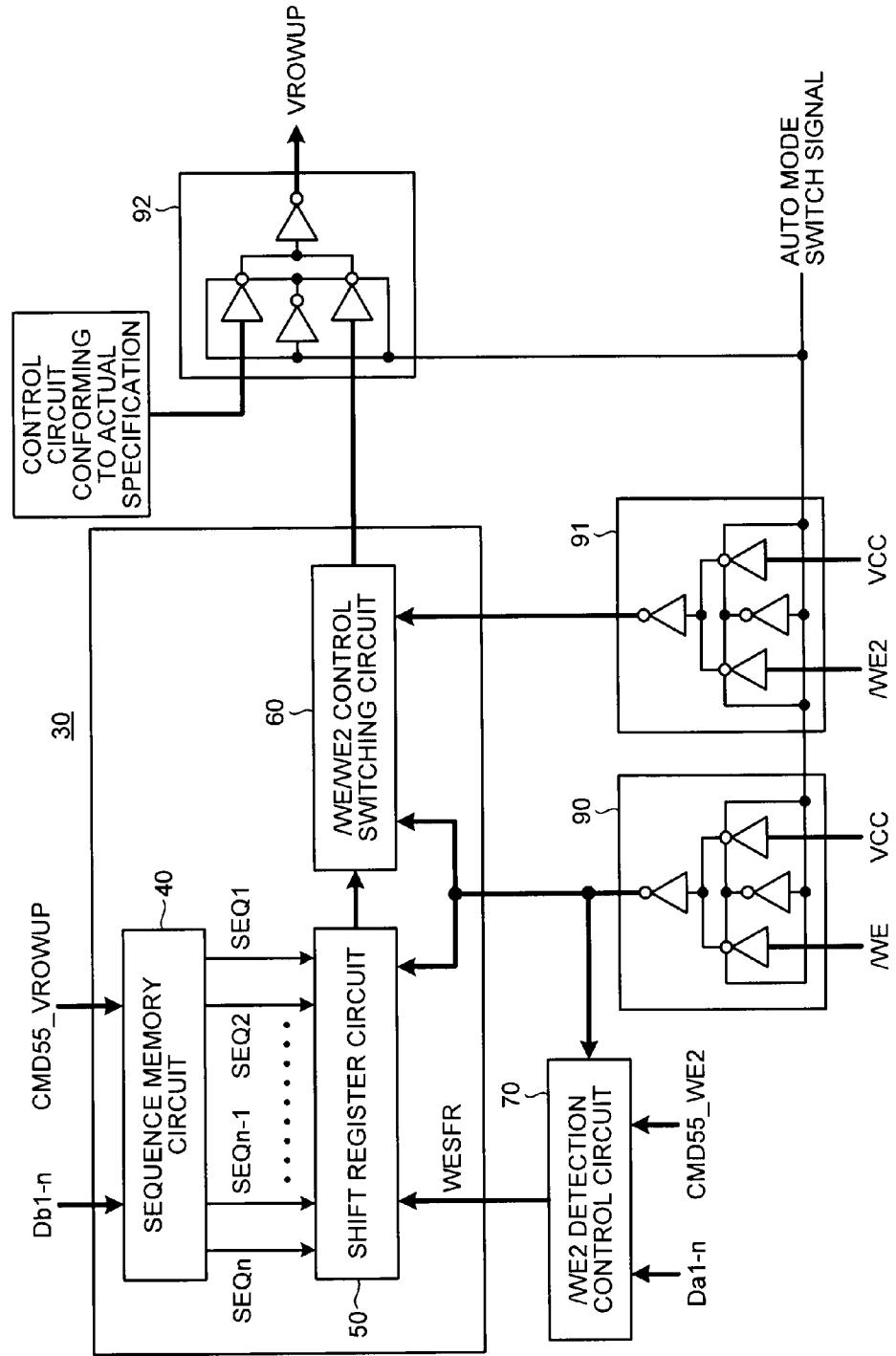
FIG. 14 is a diagram illustrating a circuit configuration example of a ReRAM device in which the test circuit is embedded.

Next, the third embodiment of the present invention is explained with reference to FIG. 14. In the third embodiment, the test circuit 30 explained in the first embodiment is mounted on the ReRAM device, and a normal use mode and a test mode can be switched in the ReRAM device. In FIG. 14, only a test system that generates the VROWUP signal is shown and test systems that generate the WLDVSEL signal and the BLSEL signal are omitted.

In the ReRAM device shown in FIG. 14, selectors 90 and 91 are provided on the input sides of the/WE signal and the/WE2 signal and a selector 92 is provided on the output side of the VROWUP signal. The selector 90 selects the/WE signal when the auto mode switch signal is on and selects a power-supply voltage Vcc when the auto mode switch signal is off. The selector 91 selects the/WE2 signal when the auto mode switch signal is on and selects the power-supply voltage Vcc when the auto mode switch signal is off. The selector 92 selects the VROWUP signal output from the test circuit 30 when the auto mode switch signal is on and selects the VROWUP signal output from a control circuit of the device when the auto mode switch signal is off.

According to the third embodiment, because the test circuit 30 is mounted on the ReRAM device, the operation verifying test can be performed in the device.

In the above embodiments, the WE2 detection signal is generated by the initial setting of the shift register circuit 72 and the pulse self-generating circuit 73; however, the L switching of the second write enable signal/WE2 can be directly detected and the WE2 detection signal can be generated based on the detection. Moreover, as the core control signal generated from the test circuit, an MWLSEL signal, a BLSWSEL, a PRECHG, a/STRB, and the like can be employed other than the VROWUP signal, the WLDVSEL signal, and the BLSEL signal.

(Fourth Embodiment)

Figure 15:
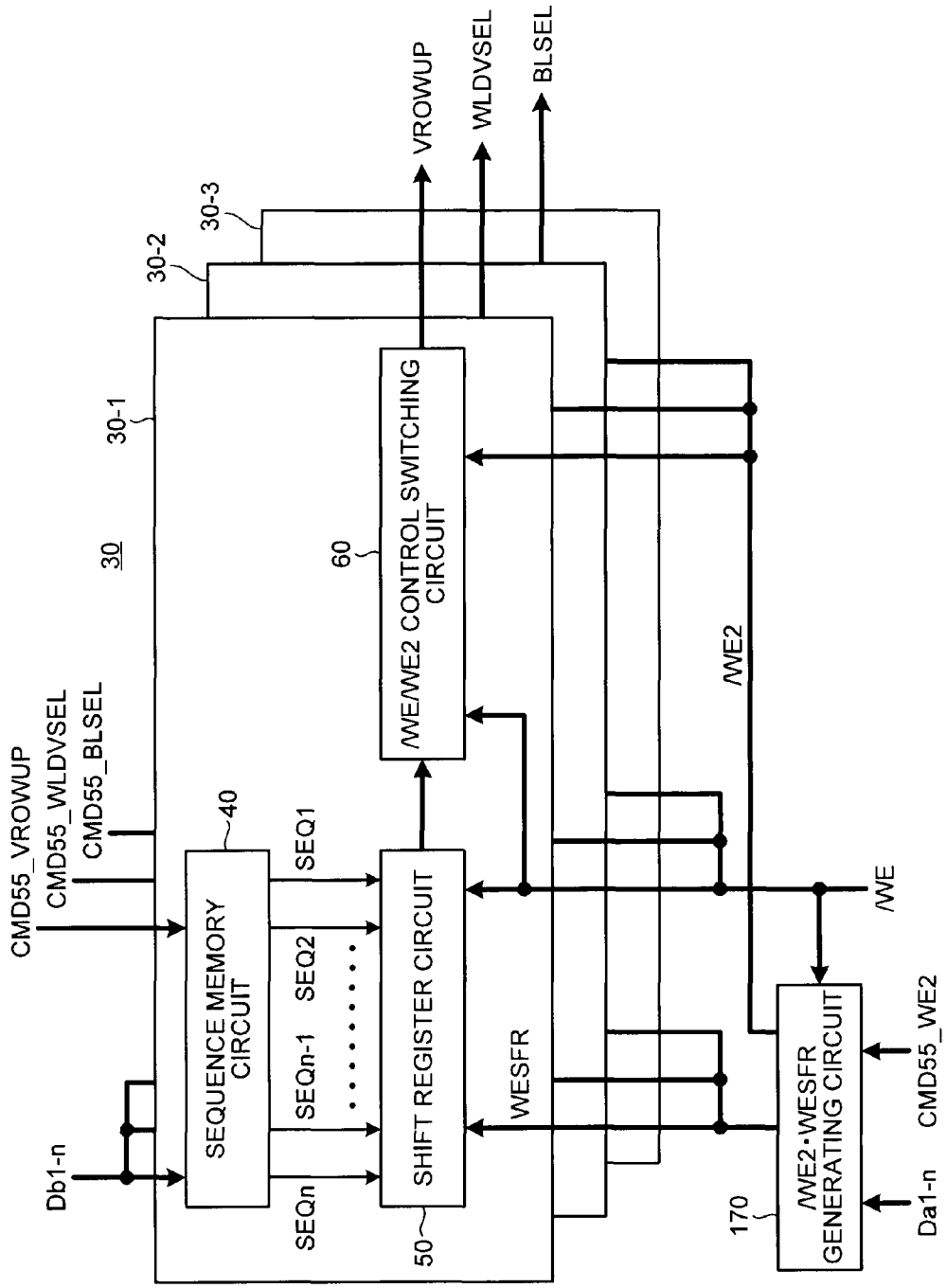
FIG. 15 is a diagram illustrating a configuration example of a test circuit according to a fourth embodiment.

Next, the test circuit 30 in the fourth embodiment is explained. FIG. 15 illustrates a configuration example of a core control signal generating portion of a test circuit for performing a test in the auto mode in which the first write enable signal (/WE) and the second write enable signal (/WE2) are used in the fourth embodiment. The test circuit 30 includes a plurality of individual test circuits 30-1 to 30-3 the number of which corresponds to the number of the required core control signals and a/WE2·WESFR generating circuit 170. In the case shown in FIG. 15, three individual test circuits 30-1 to 30-3 for generating three signals (the VROWUP signal, the WLDVSEL signal, and the BLSEL signal) as the core control signal are shown. Each of the individual test circuits 30-1 to 30-3 having the same configuration includes the sequence memory circuit 40, the shift register circuit 50, and the/WE/WE2 control switching circuit 60. Moreover, the test circuit 30 includes the/WE2·WESFR generating circuit 170 that is shared by the three individual test circuits 30-1 to 30-3. The second write enable signal (/WE2) is self-generated by the/WE2·WESFR generating circuit 170 in the test circuit 30.

The sequence memory circuit 40, the shift register circuit 50, and the/WE/WE2 control switching circuit 60 configuring each of the individual test circuits 30-1 to 30-3 have the same internal configuration as those shown in FIG. 6 and overlapping explanation is omitted.

Figure 16:
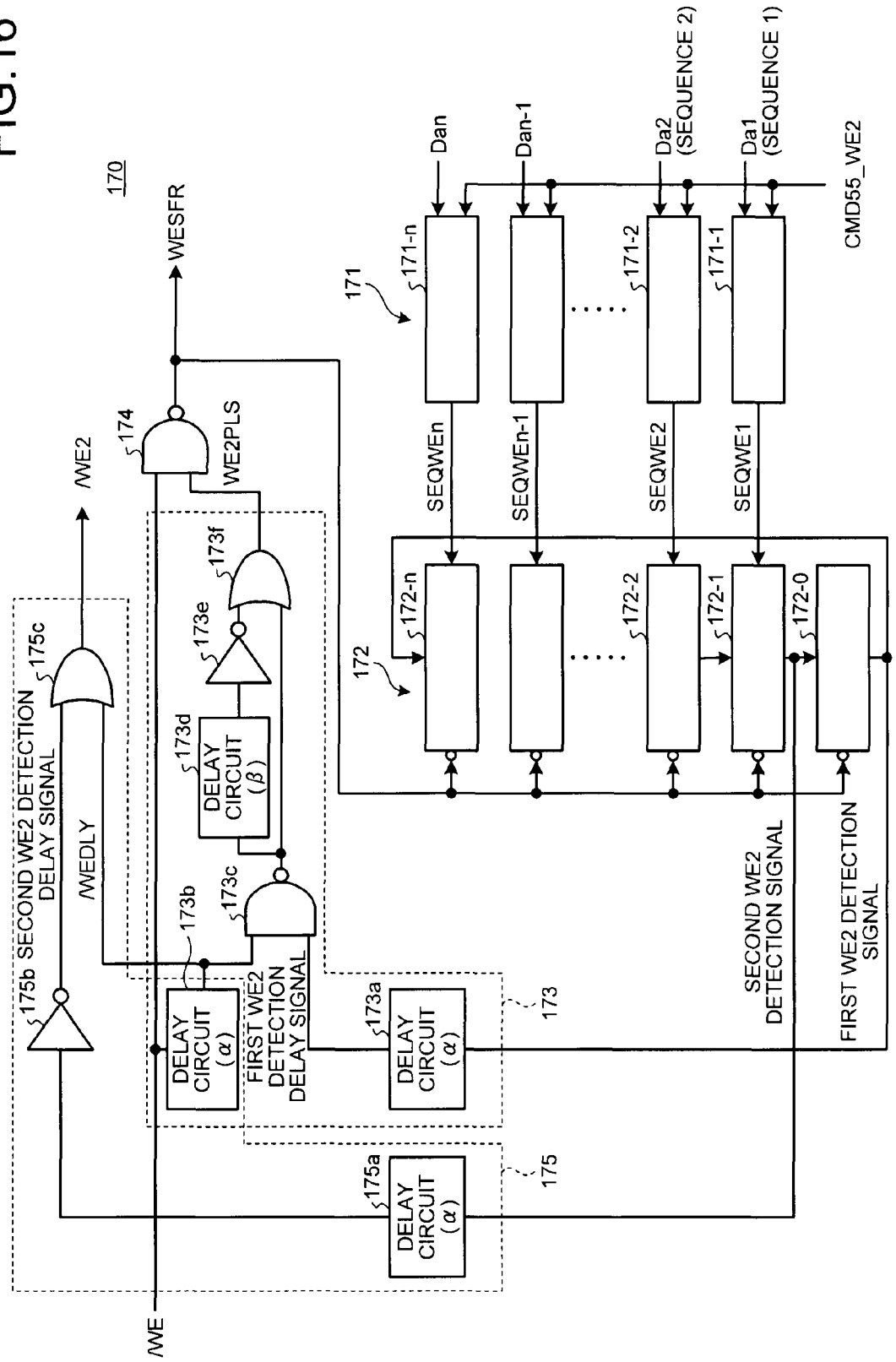
FIG. 16 is a diagram illustrating an internal configuration example of a/WE2·WESFR generating circuit according to the fourth embodiment.

FIG. 16 illustrates an internal configuration of the/WE2·WESFR generating circuit 170. The/WE2·WESFR detection control circuit 170 generates the shift control signal WESFR and the second write enable signal/WE2 based on the command (CMD55_WE2), the data Da1-n, and the first write enable signal/WE, and inputs the generated shift control signal WESFR to the shift register circuit 50 and inputs the generated second write enable signal/WE2 to the/WE/WE2 control switching circuit 60. The shift control signal WESFR is used as a shift clock for causing the shift register circuit 50 to perform a shift operation.

As shown in FIG. 16, the/WE2·WESFR generating circuit 170 includes a sequence memory circuit 171, a shift register circuit 172, a pulse self-generating circuit 173, a NAND circuit 174, and a/WE2 generating circuit 175. The pulse self-generating circuit 173 includes a delay circuit 173a, a delay circuit 173b, a NAND circuit 173c, a delay circuit 173d, a NOT circuit 173e, and an OR circuit 173f. The/WE2 generating circuit 175 includes a delay circuit 175a, a NOT circuit 175b, the delay circuit 173b, and an OR circuit 175c.

The sequence memory circuit 171 is a memory for loading an initial value to a register of each stage of the shift register circuit 172, and includes storage bits the number of which corresponds to the number that is one less than the number of stages of the shift register circuit 172. The data Da1-Dan are written in the sequence memory circuit 171 with the input of the command (CMD55_WE2) as a trigger. The data Da1-Dan that set only the cycle to which the/WE2 signal is input to 1 is written in the sequence memory circuit 171. In the sequence memory circuit 171, a memory 171-1 in which the data Da1 is written is a sequence 1, a memory 171-2 in which the data Da2 is written is a sequence 2, ..., and a memory in which the data Dan is written is a sequence n.

The n-bit data stored in the sequence memory circuit 171 is written in the registers of respective stages of the shift register circuit 172 as the initial values SEQWE1 to SEQWEn. SEQWE1 corresponds to the sequence 1, SEQWE2 corresponds to the sequence 2, and SEQWEn corresponds to the sequence n. The shift register circuit 172 performs the shift operation based on the fall of the shift control signal WESFR from H to L and includes shift stages the number of which is one more than the storage bits of the sequence memory circuit 171. Specifically, in the shift register circuit 172, data set input from the sequence memory circuit 171 is not performed on a register 172-0 of the last stage. The register 172-0 of the last stage in the shift register circuit 172 corresponds to the sequence 0. In the shift register circuit 172, the output of the register 172-0 of the last stage is fed back to the input of a register 172-n of the first stage for performing a repeat operation in units of a plurality of sequences. The output of the register 172-0 of the last stage in the shift register circuit 172 is input to the pulse self-generating circuit 173 as a first WE2 detection signal. The output of the register 172-1 one stage before the last stage of the shift register circuit 172 is input to the/WE2 generating circuit 175 as a second WE2 detection signal.

The pulse self-generating circuit 173 is a circuit for outputting the self generated pulse WE2PLS from the OR circuit 173f based on the first WE2 detection signal, and the self generated pulse WE2PLS output from the OR circuit 173f is NANDed with the first write enable signal/WE by the NAND circuit 174 and is output as the positive-logic shift control signal WESFR. In the pulse self-generating circuit 173, a first WE2 detection delay signal obtained by delaying the first WE2 detection signal by time α in the delay circuit 173a is NANDed with a/WEDLY signal obtained by delaying the first write enable signal/WE by the time α in the delay circuit 173b by the NAND circuit 173c to capture the rise of the/WEDLY signal from L to H only during the period in which the first WE2 detection delay signal is H.

Then, the output of the NAND circuit 173c is delayed by time β in the delay circuit 173d to adjust the time at which the self generated pulse WE2PLS output from the OR circuit 173f is generated. Moreover, the output of the delay circuit 173d is inverted by the NOT circuit 173e. Furthermore, the self generated pulse WE2PLS that becomes assert only during the period of the time β from the fall of the/WEDLY signal is generated by ORing the output of the NOT circuit 173e and the output of the NAND circuit 173c by the OR circuit 173f. In the NAND circuit 174, the positive-logic shift control signal (shift pulse) WESFR obtained by adding the self generated pulse WE2PLS to the first write enable signal/WE is generated and the generated shift control signal WESFR is input to the shift register circuit 172 and the shift register circuit 50.

In the/WE2 generating circuit 175, the second WE2 detection signal is delayed by the time α by the delay circuit 175a and the output of the delay circuit 175a is inverted by the NOT circuit 175b. Then, the second write enable signal/WE2 is generated by ORing the second WE2 detection delay signal as the output of the NOT circuit 175b and the/WEDLY signal obtained by delaying the first write enable signal/WE by the time α in the delay circuit 173b by the OR circuit 175c.

Next, the operations of the individual test circuit 30-1 and the/WE2·WESFR generating circuit 170 in FIG. 15 that generate the VROWUP signal as the core control signal are explained with reference to a time chart shown in FIG. 17. In this operation example, as shown in FIG. 4, the cycle time A of the sequence 1 is made shorter by using the second write enable signal/WE2 than the case of using only the first write enable signal/WE.

Figure 17:
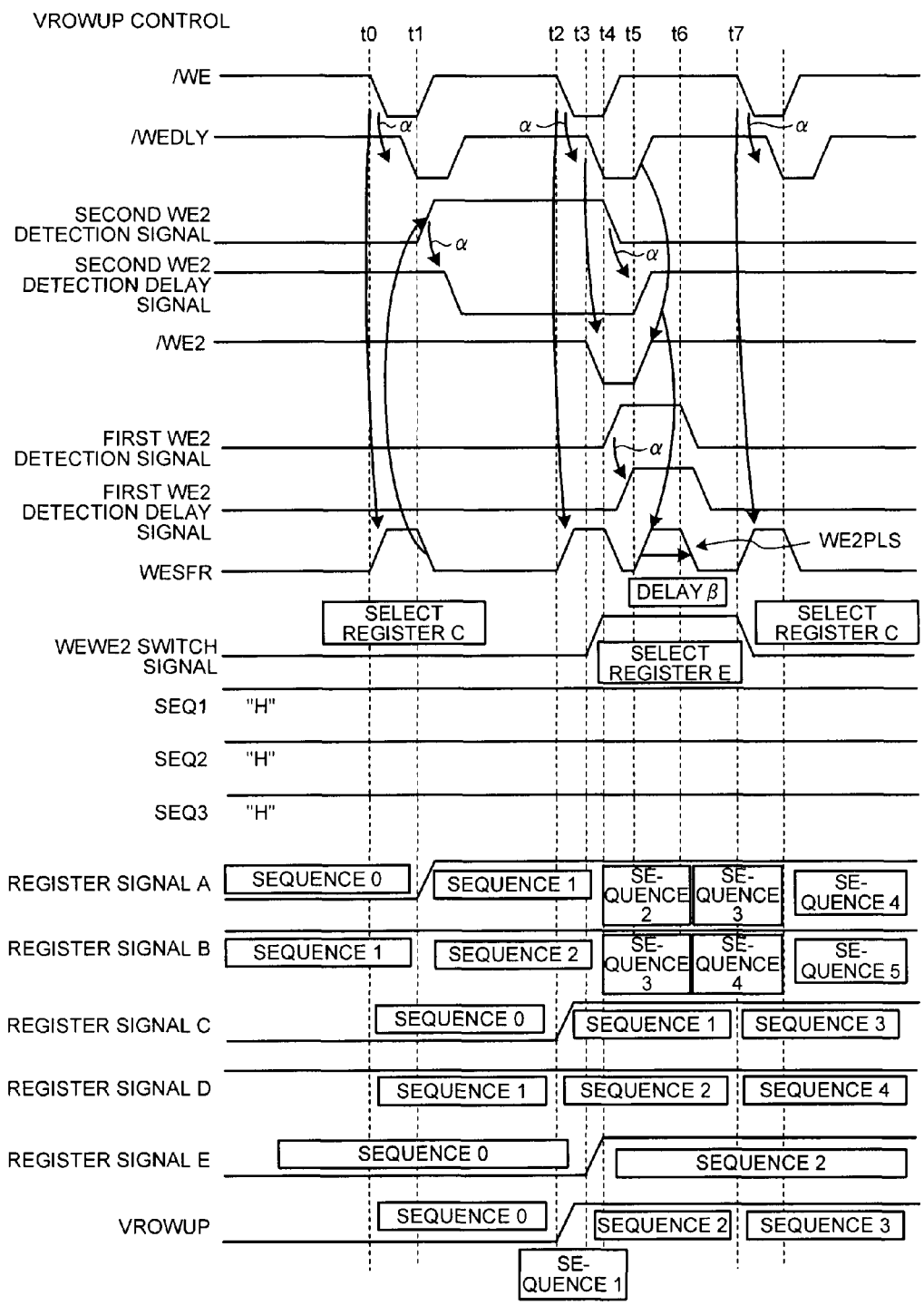
FIG. 17 is a time chart illustrating various signal waveforms for generating a VROWUP signal in the fourth embodiment.

As shown in FIG. 17, the/WE signal falls to L with a predetermined period. The/WE2 signal generated in the/WE2 generating circuit 175 is a signal having an L holding time same as that of the/WE signal, and the timing of ending the sequence whose cycle time is required to change is determined at an L switching point of the/WE2 signal. In this case, as shown in FIG. 4, because the/WE2 signal is inserted in the sequence 2, values 0, 1, 0, ... are input as the data Da1-n input to the sequence memory circuit 171. The register 172-0 on the side of the last stage of the shift register circuit 172 maintains the initial value of 0 and values 0, 1, 0 are initially set in three registers 172-1, 172-2, and 172-3 of the shift register circuit 172 subsequent to the register 172-0 by SEQWE1-3 signals.

The shift register circuit 172 performs the shift operation by the fall of the WESFR signal. As described above, the WESFR signal is obtained by ORing the inverted signal of the/WE signal and the self-generated pulse WE2PLS self-generated in the pulse self-generating circuit 173. Because values 0, 0, 1, 0 are set in the four registers on the side of the last stage of the shift register circuit 172, the second WE2 detection signal output from the register 172-1 that is one stage before the last stage rises to H at the time t1 by the first fall of the WESFR signal. The second WE2 detection signal is delayed by the time α by the delay circuit 175a, is inverted by the NOT circuit 175b, and is output from the NOT circuit 175b as the second WE2 detection delay signal to be input to the OR circuit 175c.

On the other hand, the first write enable signal/WE is delayed by the time α in the delay circuit 173b and is output from the delay circuit 173b as the/WEDLY signal to be input to the OR circuit 175c. Then, the/WEDLY signal is ORed with the second WE2 detection delay signal by the OR circuit 175c, thereby generating the second write enable signal/WE2 that becomes L only from the time 4 at which the/WEDLY signal falls to L to the time t5 at which the second WE2 detection delay signal rises to H from the OR circuit 175c.

The first WE2 detection signal output from the register 172-0 of the last stage rises to H at the time t4 by the second fall of the WESFR signal. The first WE2 detection signal is delayed by the time α by the delay circuit 173a and is input to the NAND circuit 173c. On the other hand, the first write enable signal/WE is delayed by the time α in the delay circuit 173b and is input to the NAND circuit 173c. The rise (time t5) of the/WEDLY signal from L to H is captured only during the period in which the first WE2 detection delay signal is H by the NAND circuit 173c. The output of the NAND circuit 173c is delayed by the time β in which the self generated pulse WE2PLS is generated by the delay circuit 173d, is inverted in the NOT circuit 173e, and is input to the OR circuit 173f. The self generated pulse WE2PLS that becomes assert only during the period of the delay time β from the fall time t5 of the/WEDLY signal is generated by ORing the output of the NOT circuit 173e and the output of the NAND circuit 173c by the OR circuit 173f. In this manner, the self generated pulse WE2PLS is generated by the pulse self-generating circuit 173 and one pulse is added to the WESFR signal by this self generated pulse WE2PLS.

In the NAND circuit 174, the first write enable signal/WE and the self generated pulse WE2PLS are synthesized and this synthesized signal is input to the shift register circuit 172 and the shift register circuit 50 as the positive-logic shift control signal (shift pulse) WESFR.

On the other hand, the initial values of the shift register circuit 50 are loaded at an appropriate time before the operation of the test circuit to the sequence memory circuit 40. As shown in FIG. 4, the VROWUP signal is H in the period of the sequence 1, H in the period of the sequence 2, and H in the period of the sequence 3, so that values "1", "1", and "1" are stored in the data Db1, Db2, and Db3 of the sequence memory circuit 40. The initial values stored in the sequence memory circuit 40 are set to the respective registers of the shift register circuit 50 before the shift operation of the shift register circuit 50 starts. Next, the register signals A to E are explained.

In the register signal A that is the output of the last stage of the shift register circuit 50, the initial values SEQ1, SEQ2, SEQ3, . . . appear in order in synchronization with the fall of the WESFR signal to L. Because the SEQ1, SEQ2, SEQ3=1, 1, 1, the register signal A rises to H at the time t1 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=1, 1, the register signal B holds H from the beginning.

To the register signal C that is the output of the register circuit 63, the input signal (register signal A) is transferred only when the first write enable signal/WE is switched to L, so that the register signal C rises to H at the fall time t2 of the/WE signal.

To the register signal D that is the output of the first-stage register circuit 65, the input signal (register signal B) is transferred only when the first write enable signal/WE is switched to L, so that the register signal D holds H from the beginning in the similar manner to the register signal B.

The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E rises to H at the fall time t3 of the/WE2 signal.

The WEWE2 switch signal output from the SRFF 62 is a switching signal between the register signal C and register signal E, and rises to H by the fall of the/WE2 signal and falls to L by the fall of the/WE signal thereafter. The selector circuit 68 selects the register signal C when the WEWE2 switch signal is L and selects the register signal E when the WEWE2 switch signal is H. Therefore, the VROWUP signal that is the output of the selector circuit 68 holds L until the time t2 and holds H after the time t2.

In this manner, at the time of the control by the second write enable signal/WE2, the register signals A and B perform the shift operation one more time by the self generation of the shift control signal WESFR after the/WE signal is switched to H. On the other hand, because the register signals C and D capture the input signal only when the/WE signal is switched to L, the register signals C and D are not subjected to the control by the self generation of the shift control signal WESFR and sequence information before performing the shift operation one more time is held. Furthermore, the register signal D is transferred to the register signal E only when the/WE2 signal is switched to L. Thereafter, information on the register signal C and the register signal E is transferred to the core control signal by using the WEWE2 switch signal, thereby realizing changing of the cycle time in the sequence 1 and the sequence 3.

Figure 18:
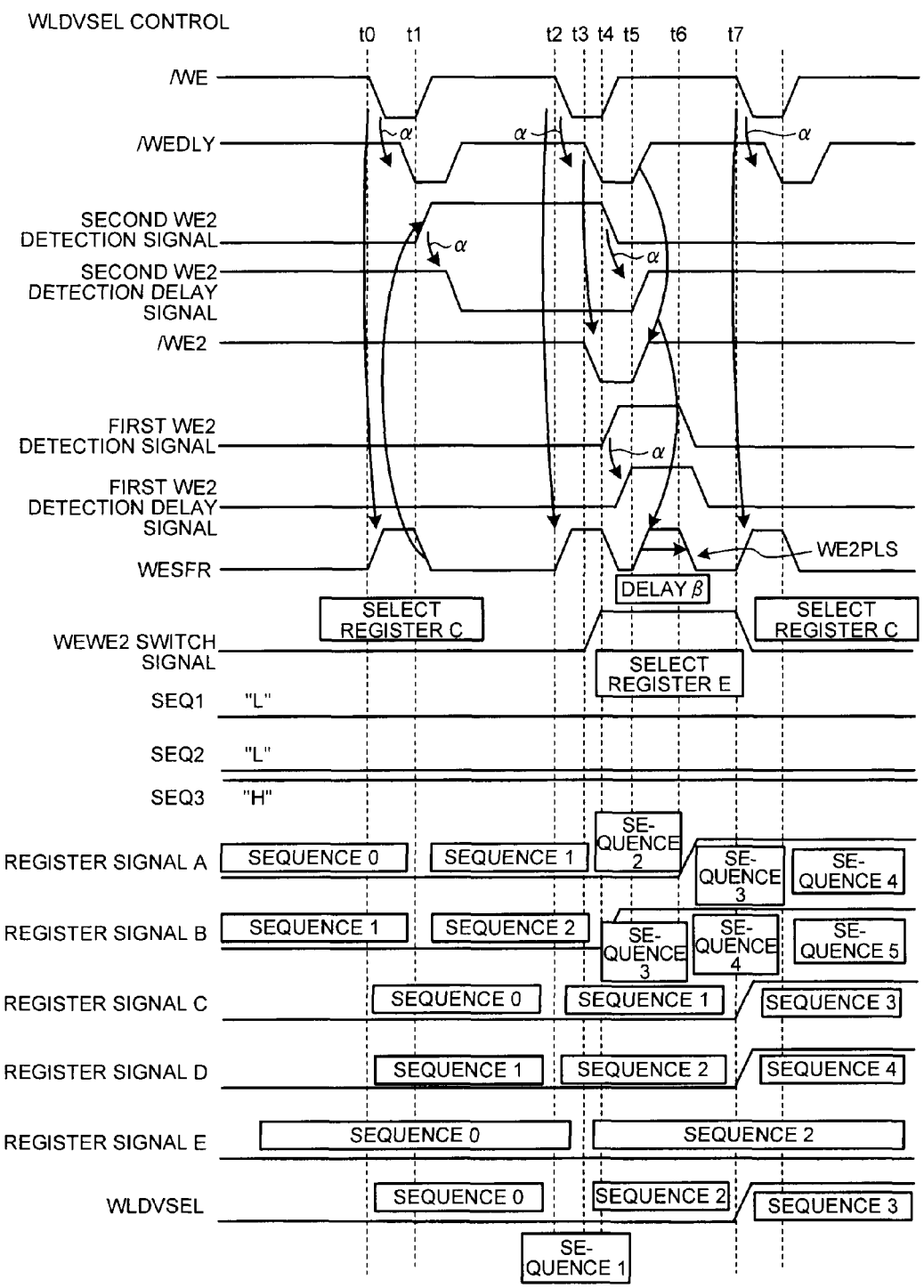
FIG. 18 is a time chart illustrating various signal waveforms for generating a WLDVSEL signal in the fourth embodiment.

Next, the operations of the individual test circuit 30-2 and the/WE2·WESFR generating circuit 170 in FIG. 15 that generate the WLDVSEL signal as the core control signal are explained with reference to a time chart shown in FIG. 18. The waveforms of the/WE, the/WEDLY, the second WE2 detection signal, the second WE2 detection delay signal, the/WE2, the first WE2 detection signal, the first WE2 detection delay signal, the WESFR, and the WEWE2 switch signal shown in FIG. 18 are similar to those shown in FIG. 17.

As shown in FIG. 4, the WLDVSEL signal is L in the period of the sequence 1, L in the period of the sequence 2, and H in the period of the sequence 3, so that values "0", "0", and "1" are stored as the data Db1, Db2, and Db3 stored in the sequence memory circuit 40.

In the register signal A that is the output of the last stage of the shift register circuit 50, the initial values SEQ1, SEQ2, SEQ3, . . . appear in order in synchronization with the fall of the WESFR signal to L.

Because the SEQ1, SEQ2, SEQ3=0, 0, 1, the register signal A rises to H at the time t6 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=0, 1, the register signal B rises to H at the time t4 and holds H for a predetermined period thereafter.

To the register signal C that is the output of the register circuit 63, the input signal (register signal A) is transferred only when the first write enable signal/WE is switched to L, so that the register signal C rises to H at the fall time t7 of the/WE signal.

To the register signal D that is the output of the first-stage register circuit 65, the input signal (register signal B) is transferred only when the first write enable signal/WE is switched to L, so that the register signal D rises to H at the fall time t7 of the/WE signal. The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E holds L during the time shown in FIG. 18.

The selector circuit 68 selects the register signal C when the WEWE2 switch signal is L and selects the register signal E when the WEWE2 switch signal is H. Therefore, the WLDVSEL signal that is the output of the selector circuit 68 holds L until the time t7 and holds H after the time t7.

Figure 19:
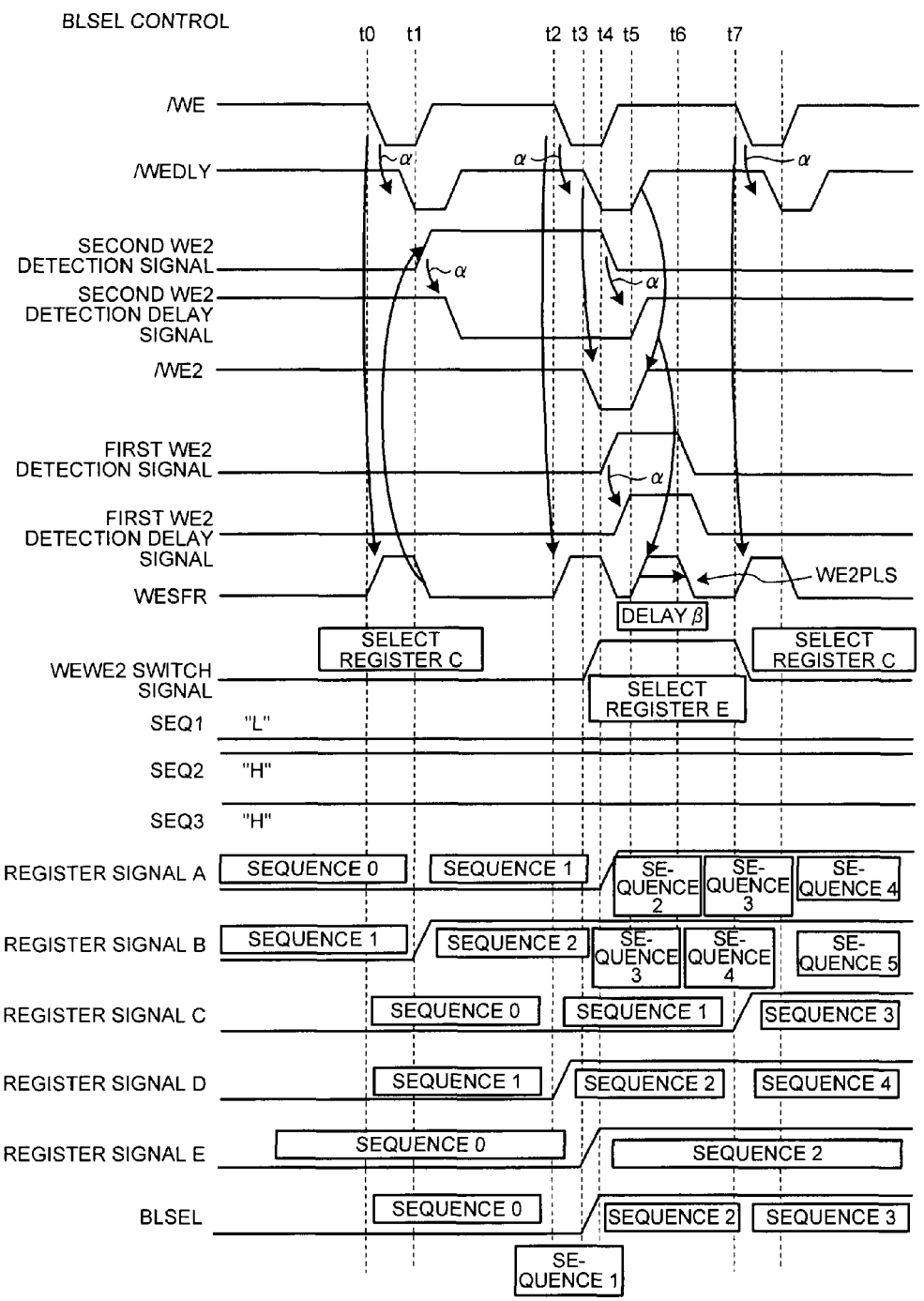
FIG. 19 is a time chart illustrating various signal waveforms for generating a BLSEL signal in the fourth embodiment.

Next, the operations of the individual test circuit 30-3 and the/WE2·WESFR generating circuit 170 in FIG. 15 that generate the BLSEL signal as the core control signal are explained with reference to a time chart shown in FIG. 19. The waveforms of the/WE, the/WEDLY, the second WE2 detection signal, the second WE2 detection delay signal, the/WE2, the first WE2 detection signal, the first WE2 detection delay signal, the WESFR, and the WEWE2 switch signal shown in FIG. 19 are similar to those shown in FIG. 17 and FIG. 18.

As shown in FIG. 4, the BLSEL signal is L in the period of the sequence 1, H in the period of the sequence 2, and H in the period of the sequence 3, so that values "0", "1", and "1" are stored as the data Db1, Db2, and Db3 stored in the sequence memory circuit 40.

In the register signal A that is the output of the last stage of the shift register circuit 50, the initial values SEQ1, SEQ2, SEQ3, . . . appear in order in synchronization with the fall of the WESFR signal to L. Because the SEQ1, SEQ2, SEQ3=0, 1, 1, the register signal A rises to H at the time t4 and holds H for a predetermined period thereafter.

In the register signal B that is the output of the stage one stage before the last stage of the shift register circuit 50, the initial values SEQ2, SEQ3, . . . appear in order in synchronization with the fall of the WESFR signal to L. Because the SEQ2, SEQ3=1, 1, the register signal B rises to H at the time t1 and holds H for a predetermined period thereafter.

To the register signal C that is the output of the register circuit 63, the input signal (register signal A) is transferred only when the first write enable signal/WE is switched to L, so that the register signal C rises to H at the fall time t7 of the/WE signal.

To the register signal D that is the output of the first-stage register circuit 65, the input signal (register signal B) is transferred only when the first write enable signal/WE is switched to L, so that the register signal D rises to H at the fall time t2 of the/WE signal.

The second-stage register circuit 66 transfers the input signal (register signal D) to the output thereof only when the second write enable signal/WE2 is switched to L, and the third-stage register circuit 67 also transfers the input signal to the output (register signal E) thereof only when the second write enable signal/WE2 is switched to L, so that the register signal E rises to H at the fall time t3 of the/WE2 signal.

The selector circuit 68 selects the register signal C when the WEWE2 switch signal is L and selects the register signal E when the WEWE2 switch signal is H. Therefore, the BLSEL signal that is the output of the selector circuit 68 holds L until the time t3 and holds H after the time t3.

The above test circuits shown in FIG. 15 operate normally even when only the first write enable signal/WE is used and the second write enable signal/WE2 is not used. When the second write enable signal/WE2 is not used, only the register signals A and C are used and the register signals B, D, and E are not used. In this case, the register signal A holds arbitrary sequence data during the period from the L switching time to the next L switching time of the shift control signal WESFR controlled only by the first write enable signal/WE, and the first write enable signal/WE is switched to L during this period, so that the arbitrary sequence data is output at the L switching time of the first write enable signal/WE.

In the test circuit, the operation verifying test for the ReRAM is performed by inputting the core control signals (the VROWUP signal, the WLDVSEL signal, and the BLSEL signal) generated in this manner to the ReRAM as a test target device and checking the output thereof through monitoring.

Figure 20:
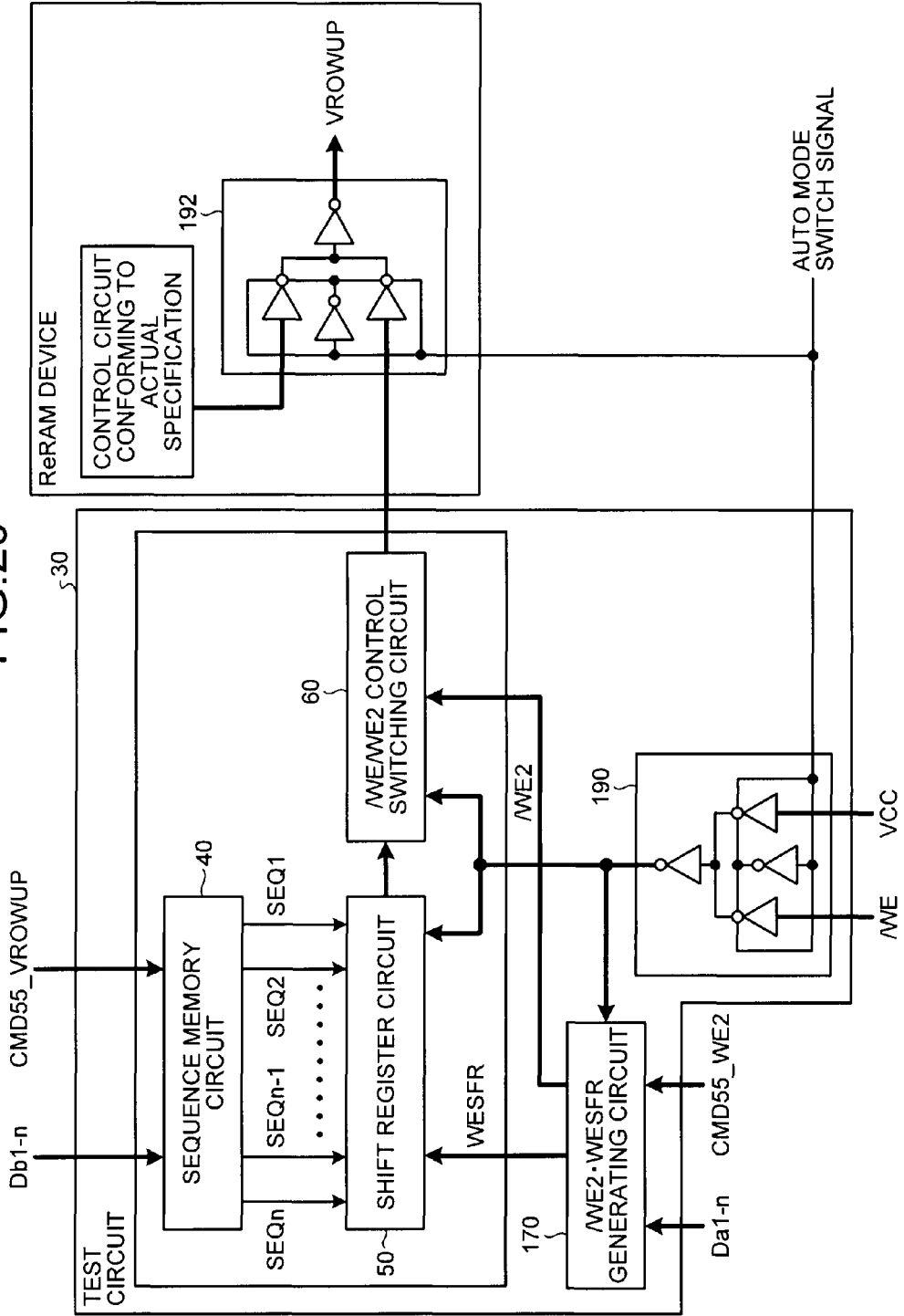
FIG. 20 is a diagram illustrating a connection relationship between the test circuit and a ReRAM device.

FIG. 20 is a diagram illustrating a connection form between the test circuit 30 and a ReRAM device. A normal use mode and a test mode can be switched in the ReRAM device. In FIG. 20, only a test system that generates the VROWUP signal is shown and test systems that generate the WLDVSEL signal and the BLSEL signal are omitted.

In the test circuit 30 shown in FIG. 20, a selector 190 is provided on the input side of the/WE signal and a selector 192 is provided on the output side of the VROWUP signal. The selector 190 selects the/WE signal when the auto mode switch signal is on and selects the power-supply voltage Vcc when the auto mode switch signal is off. The selector 192 selects the VROWUP signal output from the test circuit 30 when the auto mode switch signal is on and selects the VROWUP signal output from a control circuit of the device when the auto mode switch signal is off.

According to the fourth embodiment, because the second write enable signal/WE2 can be used other than the first write enable signal/WE used for controlling the cycle in the normal operation, an arbitrary cycle can be locally set in the cycle time different from other cycles, so that it is possible to perform the operation verifying test for the limit time of the time interval of activation and deactivation of the word line and the bit line in the ReRAM operating at high speed. Moreover, the second write enable signal/WE2 is self-generated by the control only by the sequence memory circuit 171 and the delay circuits 175a and 173b in the test circuit 30 based on the first write enable signal/WE, so that a signal pad for the second write enable signal/WE2 is not needed, enabling to reduce the chip size of the test circuit and also the test cost compared with the case of externally inputting the second write enable signal/WE2.

(Fifth Embodiment)

Figures 21, 22:
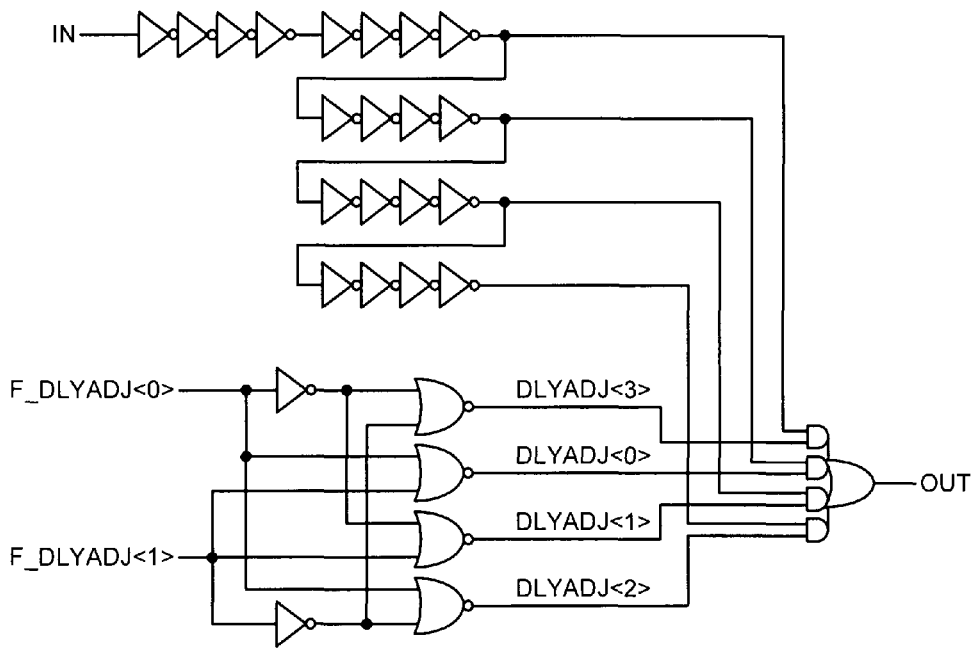
FIG. 21 is a diagram illustrating a specific example of a delay circuit.
FIG. 22 is a diagram illustrating a switching operation of the delay circuit.

Next, the fifth embodiment of the present invention is explained with reference to FIG. 21 and FIG. 22. FIG. 21 illustrates a specific example of the delay circuits 173a, 173b, 173d, and 175a used in the/WE2·WESFR generating circuit 170. In the delay circuit shown in FIG. 21, the number of stages of the delay inverter can be switched in four stages. In the delay circuit shown in FIG. 21, as shown in FIG. 22, the delay time can be switched between 12 stages, 16 stages, 20 stages, and 8 stages in the number of the inverters by switching delay time control signals F_DLYADJ<1>and F_DLYADJ<0>to 01, 10, and 11 from 00 as a default. With the use of such a delay circuit, adjustment of the delay time by soft set, fuse trim or the like can be realized.

(Sixth Embodiment)

Figure 23:
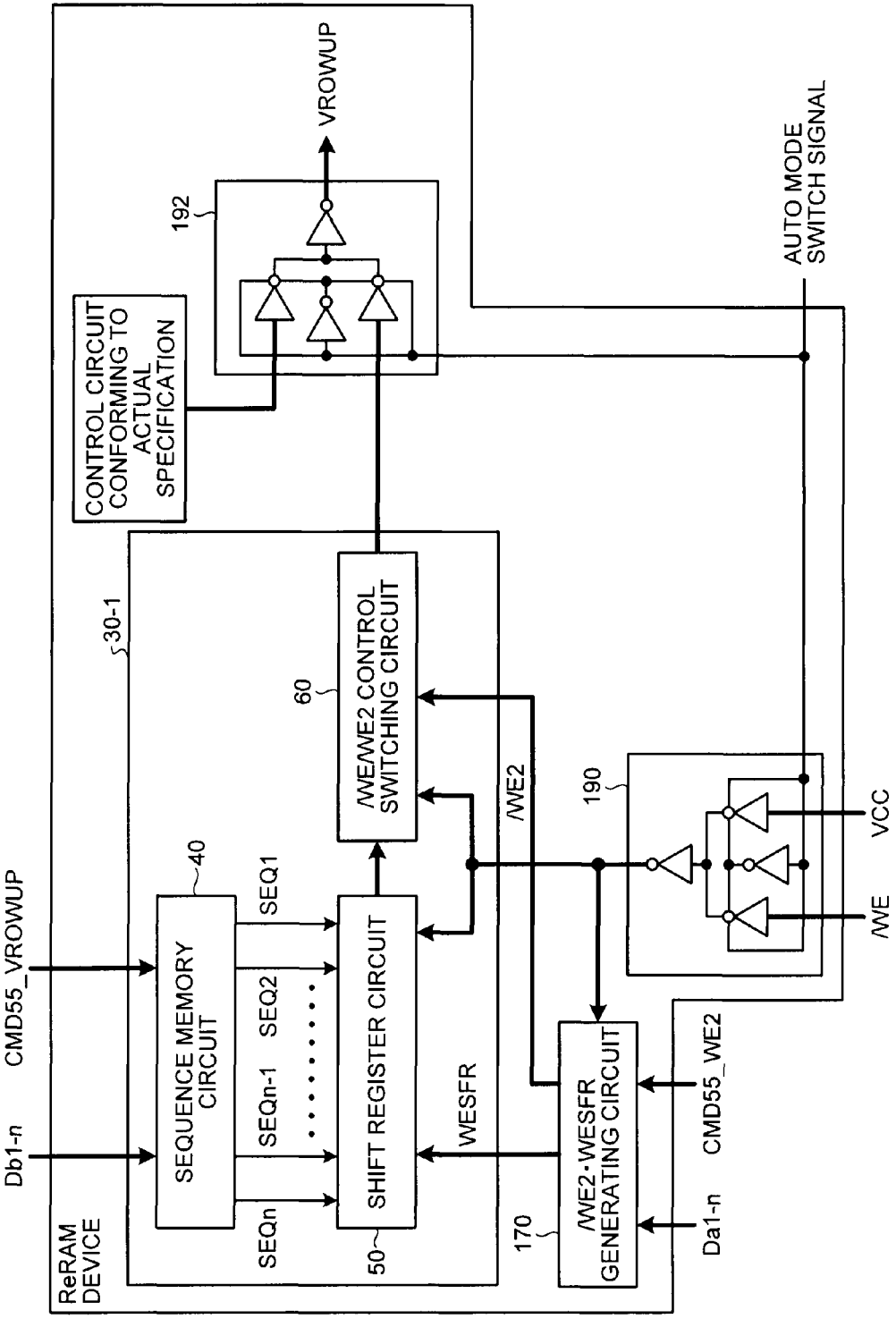
FIG. 23 is a diagram illustrating a circuit configuration example of a ReRAM device in which the test circuit is embedded.

Next, the sixth embodiment of the present invention is explained with reference to FIG. 23. In the sixth embodiment, the test circuit 30 explained in the fourth embodiment is mounted on the ReRAM device, and a normal use mode and a test mode can be switched in the ReRAM device. In FIG. 23, only a test system that generates the VROWUP signal is shown and test systems that generate the WLDVSEL signal and the BLSEL signal are omitted.

In the ReRAM device shown in FIG. 23, the selector 190 is provided on the input sides of the/WE signal and the/WE2 signal and the selector 192 is provided on the output side of the VROWUP signal. The selector 190 selects the/WE signal when the auto mode switch signal is on and selects the power-supply voltage Vcc when the auto mode switch signal is off. The selector 192 selects the VROWUP signal output from the test circuit 30 when the auto mode switch signal is on and selects the VROWUP signal output from a control circuit of the device when the auto mode switch signal is off.

According to the sixth embodiment, because the test circuit 30 is mounted on the ReRAM device, the operation verifying test can be performed in the device.

As the core control signal generated from the test circuit, an MWLSEL signal, a BLSWSEL, a PRECHG, a/STRB, and the like can be employed other than the VROWUP signal, the WLDVSEL signal, and the BLSEL signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A test device for performing an operation verifying test on a resistive random access memory in which a memory element including a rectifier element and a variable resistance element is arranged at each intersection of a plurality of word lines and a plurality of bit lines and which performs activation/deactivation control of the word lines and activation/deactivation control of the bit lines by using a plurality of core control signals synchronized with a write enable signal and changing one of the core control signals corresponding to each start point of a plurality of sequences, the test device comprising:
   a shift pulse generating circuit that generates a shift pulse based on a first write enable signal that changes with a constant period and a self generated pulse that is self-generated by using a second write enable signal that changes corresponding to a sequence whose limit time is checked among the sequences;
   a plurality of shift register circuits each of which includes a plurality of stages of registers that perform a shift operation by the shift pulse and in each of which a signal in each of the sequences of the core control signal to be generated is initially set; and
   a plurality of core control signal generating circuits each of which includes
      a first latch circuit that latches an output of a last stage of the shift register circuit by the first write enable signal,
      a second latch circuit that latches an output of a stage that is one stage before the last stage of the shift register circuit by the first write enable signal,
      a third latch circuit that latches an output of the second latch circuit by the second write enable signal, and
      a selector circuit that selects an output of the second latch circuit and the third latch circuit by a switch signal formed by the first write enable signal and the second write enable signal and outputs as the core control signal.

2. The test device for a resistive random access memory according to claim 1, wherein the second write enable signal has an assert holding period same as the first write enable signal and changes from negate to assert after the limit time to be checked from a point at which the first write enable signal changes from negate to assert.

3. The test device for a resistive random access memory according to claim 1, wherein
   the shift pulse generating circuit includes
      a second shift register circuit that includes a plurality of stages of registers that perform the shift operation and is initially set so that only a register corresponding to a sequence in which the second write enable signal changes becomes assert,
      a pulse self-generating circuit that generates the self-generated pulse in the sequence in which the second write enable signal changes based on an output of the second shift register circuit and the first write enable signal, and
      a circuit that generates the shift pulse that is obtained by adding the self-generated pulse to the first write enable signal based on the first write enable signal and the self-generated pulse and inputs a generated shift pulse to the shift register circuits.

4. The test device for a resistive random access memory according to claim 2, wherein
   the shift pulse generating circuit includes
      a second shift register circuit that includes a plurality of stages of registers that perform the shift operation and is initially set so that only a register corresponding to a sequence in which the second write enable signal changes becomes assert,
      a pulse self-generating circuit that generates the self-generated pulse in the sequence in which the second write enable signal changes based on an output of the second shift register circuit and the first write enable signal, and
      a circuit that generates the shift pulse that is obtained by adding the self-generated pulse to the first write enable signal based on the first write enable signal and the self-generated pulse and inputs a generated shift pulse to the shift register circuits.

5. The test device for a resistive random access memory according to claim 1, wherein
   the shift register circuits each include the registers whose number of stages corresponds to number of the sequences, and
   an output of a register in the last stage is fed back to a register in a first stage.

6. The test device for a resistive random access memory according to claim 3, wherein
   the second shift register circuit includes the registers whose number of stages corresponds to number of the sequences, and
   an output of a register in a last stage is fed back to a register in a first stage.

7. The test device for a resistive random access memory according to claim 1, wherein the selector circuit includes
- a set-reset flip-flop that forms a select control signal for selecting the output of the second latch circuit and the third latch circuit by the first write enable signal and the second shift register circuit, and
- a selector that selectively selects the output of the second latch circuit and the third latch circuit in accordance with the select control signal and outputs as the core control signal.

8. The test device for a resistive random access memory according to claim 1, wherein the resistive random access memory performs a first operation of switching all of the word lines from negate to assert, a second operation of switching a selected bit line from negate to assert, and a third operation of switching a selected word line from assert to negate, at a time of active based on the core control signals, and performs a fourth operation of switching the selected bit line from assert to negate and a fifth operation of switching a non-selected word line from assert to negate, at a time of precharge, based on the core control signals, and the sequence whose limit time is checked is a sequence from a start of the first operation to a start of the second operation, a sequence from a start of the second operation to a start of the third operation, or a sequence from a start of the fourth operation to a start of the fifth operation.

9. A test method for performing an operation verifying test on a resistive random access memory in which a memory element including a rectifier element and a variable resistance element is arranged at each intersection of a plurality of word lines and a plurality of bit lines and which performs activation/deactivation control of the word lines and activation/deactivation control of the bit lines by using a plurality of core control signals synchronized with a write enable signal, the test method comprising:

inputting a first write enable signal that changes with a constant period and a second write enable signal that changes at a time portion in which a limit time between the activation/deactivation control of the word lines and the activation/deactivation control of the bit lines is checked;

generating the core control signals in which a time interval with which the core control signals change is locally shorter than a period of the first write enable signal based on the first write enable signal and the second write enable signal that are input; and performing an operation verification on the resistive random access memory by using generated core control signals.

* * * * *